(12) United States Patent
McEldowney et al.

(10) Patent No.: US 11,781,913 B2
(45) Date of Patent: Oct. 10, 2023

(54) POLARIMETRIC IMAGING CAMERA

(71) Applicant: Facebook Technologies, LLC, Menlo Park, CA (US)

(72) Inventors: Scott Charles McEldowney, Redmond, WA (US); Xinqiao Liu, Medina, WA (US); Qing Chao, Redmond, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 44 days.

(21) Appl. No.: 17/238,636

(22) Filed: Apr. 23, 2021

(65) Prior Publication Data

US 2021/0333150 A1 Oct. 28, 2021

Related U.S. Application Data

(60) Provisional application No. 63/015,186, filed on Apr. 24, 2020.

(51) Int. Cl.
*G01J 4/04* (2006.01)

(52) U.S. Cl.
CPC ....................................... *G01J 4/04* (2013.01)

(58) Field of Classification Search
CPC .... G01J 4/04; G01J 3/0224; G01J 2003/1213; G01J 2003/2806; G01J 2004/001;
(Continued)

(56) References Cited

U.S. PATENT DOCUMENTS

| 10,620,116 | B2 * | 4/2020 | Kojima | ............... | H01L 27/1462 |
| 2006/0152812 | A1 | 7/2006 | Woodgate et al. | | |

(Continued)

FOREIGN PATENT DOCUMENTS

| CN | 103472592 A | * | 12/2013 |
| CN | 103472592 B | | 11/2015 |

(Continued)

OTHER PUBLICATIONS

Hsu, et al., "Full-Stokes Imaging Polarimeter Using an Array of Elliptical Polarizer", Optics Express, vol. 22, No. 3, Feb. 10, 2014, pp. 3063-3074.
PCT/US2021/029006, "International Search Report and Written Opinion", dated Aug. 9, 2021, 13 pages.
Shen, et al., "Optimizing the Design of an Embedded Grating Polarizer for Infrared Polarization Light Field Imaging", Results in Physics, vol. 12, Mar. 2, 2019, pp. 21-31.
(Continued)

*Primary Examiner* — Michael P Stafira
(74) *Attorney, Agent, or Firm* — Kilpatrick Townsend & Stockton LLP

(57) ABSTRACT

In one example, an apparatus comprises a plurality of sub-pixels arranged sideway, a shared optical element positioned over the plurality of sub-pixels, the shared optical element being configured to direct light originating from a same location in a scene to each sub-pixel in the plurality of sub-pixels; one or more polarizers positioned between the shared optical element and one or more first sub-pixels of the plurality of sub-pixels and configured to selectively pass one or more components of the light having one or more pre-determined polarization states, to enable the photodiodes of each of the one or more first sub-pixels to generate signals based on intensities of the one or more components; and one or more processors configured to generate polarimetric measurements of the received light based on signals obtained from the photodiodes of the one or more first sub-pixels and polarization properties of the one or more polarizers.

20 Claims, 24 Drawing Sheets

(58) Field of Classification Search
CPC ...... G01J 2004/002; G01J 4/00; G01J 3/0256;
G01J 3/12; G01J 2003/282; G01J 3/0205;
G01J 3/0262; G01J 3/0297; G01J 3/2823;
G01J 3/36; G01J 3/513; G01J 2004/005;
G01J 3/0259; G01J 2003/2826; G01J
3/447; G01J 3/0237; G01J 3/0208; G01J
5/59; G01J 2005/0077; G01J 4/02; G01J
5/10; G01J 1/04; G01J 1/22; G01J
2003/1269; G01J 2003/451; G01J 3/02;
G01J 3/26; G01J 3/4412; G01J 3/45;
G01J 9/02; G01J 5/0802; G01J 5/0806;
G01J 5/0821; G01J 5/0881; G01J 5/58;
G01J 1/0407; G01J 11/00; G01J
2009/0261; G01J 2009/0265; G01J 3/021;
G01J 3/0218; G01J 3/2803; G01J 3/44;
G01J 5/00; G01J 5/80; G01J 1/0429;
G01J 1/0488; G01J 1/42; G01J
2003/2813; G01J 3/42; G01J 3/453; G01J
5/53; G01J 1/0411; G01J 1/58; G01J
2003/1291; G01J 2003/2816; G01J
3/0229; G01J 3/027; G01J 3/10; G01J
3/433; G01J 3/443; G01J 3/4531; G01J
3/50; G01J 5/0018; G01J 5/20; G01J
5/52; G01J 5/802
See application file for complete search history.

(56) References Cited

U.S. PATENT DOCUMENTS

| | | |
|---|---|---|
| 2006/0273239 A1 | 12/2006 | McGrath et al. |
| 2007/0241267 A1* | 10/2007 | Gruev ...................... G01J 4/04 250/225 |
| 2008/0090182 A1 | 4/2008 | Suzuki et al. |
| 2013/0207214 A1 | 8/2013 | Haddad et al. |
| 2013/0270421 A1* | 10/2013 | Kanamori ............. G01J 3/0205 250/208.1 |
| 2014/0009757 A1 | 1/2014 | Bodkin et al. |
| 2016/0195429 A1 | 7/2016 | Boettiger |
| 2018/0059361 A1 | 3/2018 | Irie |
| 2018/0100731 A1 | 4/2018 | Pau |
| 2019/0265477 A1 | 8/2019 | Perreault et al. |
| 2020/0013819 A1 | 1/2020 | Toda |
| 2020/0228732 A1 | 7/2020 | Yamaguchi et al. |
| 2020/0273892 A1 | 8/2020 | Perkins et al. |
| 2020/0321379 A1* | 10/2020 | Cheng ............... H01L 27/14603 |
| 2021/0084284 A1* | 3/2021 | Mceldowney ....... H04N 13/257 |
| 2021/0174528 A1* | 6/2021 | Mordechai ............. G01S 17/46 |
| 2021/0264169 A1* | 8/2021 | Speigle ................ G06V 20/588 |

FOREIGN PATENT DOCUMENTS

| | | | | |
|---|---|---|---|---|
| CN | 108088564 A | * | 5/2018 | |
| CN | 108088564 A | | 5/2018 | |
| WO | WO-2009112174 A1 | * | 9/2009 | ............ B82Y 20/00 |
| WO | WO-2013031100 A1 | * | 3/2013 | ......... A61B 1/00186 |
| WO | WO-2013034941 A2 | * | 3/2013 | ................ G01J 4/02 |
| WO | WO-2018159738 A1 | * | 9/2018 | ................ G01J 4/00 |
| WO | 2020066738 A1 | | 4/2020 | |
| WO | WO-2020066738 A1 | * | 4/2020 | ................ G01J 4/04 |
| WO | WO-2020100431 A1 | * | 5/2020 | ................ G01J 4/04 |

OTHER PUBLICATIONS

International Search Report and Written Opinion for International Application No. PCT/US2021/057989, dated Feb. 23, 2022, 10 pages.

Non-Final Office Action dated Dec. 23, 2022 for U.S. Appl. No. 17/514,286, filed Oct. 29, 2021, 19 pages.

Final Office Action dated Jun. 26, 2023 for U.S. Appl. No. 17/514,286, filed Oct. 29, 2021, 20 pages.

* cited by examiner $$\mathbf{S} = \begin{pmatrix} S_0 \\ S_1 \\ S_2 \\ S_3 \end{pmatrix} = \begin{pmatrix} I_H + I_V \\ I_H - I_V \\ I_{+45} - I_{-45} \\ I_{RHC} - I_{LHC} \end{pmatrix} = \begin{pmatrix} \langle E_H E_H^* + E_V E_V^* \rangle \\ \langle E_H E_H^* - E_V E_V^* \rangle \\ \langle E_H E_V^* + E_V E_H^* \rangle \\ \langle i(E_H E_V^* - E_V E_H^*) \rangle \end{pmatrix}$$

FIG. 3A

$$DoP = \frac{\sqrt{S_1^2 + S_2^2 + S_3^2}}{S_0} \qquad DoP_L = \frac{\sqrt{S_1^2 + S_2^2}}{S_0} \qquad DoP_C = \frac{S_3}{S_0}$$

FIG. 3B

$$\begin{bmatrix} S_0 \\ S_1 \\ S_2 \\ S_3 \end{bmatrix}' = \begin{bmatrix} m_{00} & m_{10} & m_{20} & m_{30} \\ m_{01} & m_{11} & m_{21} & m_{31} \\ m_{02} & m_{12} & m_{22} & m_{32} \\ m_{03} & m_{13} & m_{23} & m_{33} \end{bmatrix} \begin{bmatrix} S_0 \\ S_1 \\ S_2 \\ S_3 \end{bmatrix}$$

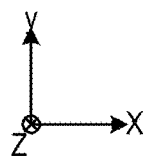
728
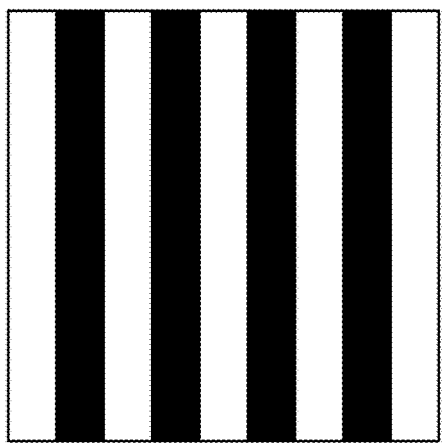
730
732
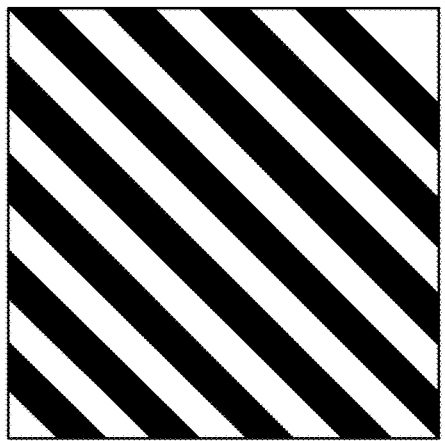
734
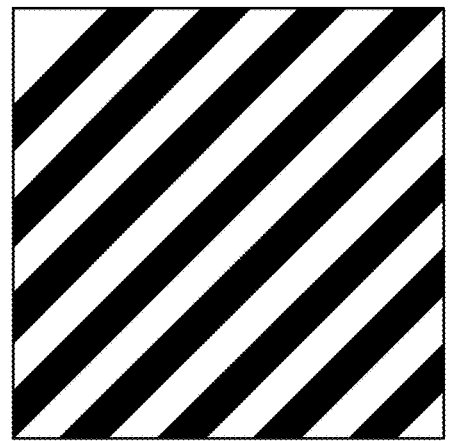
FIG. 7B

1002

RGB Classification

| γ/λ | 451 nm | 524 nm | 662 nm |
|---|---|---|---|
| 20° | 0.59±0.05 | 0.55±0.04 | 0.62±0.09 |
| 30° | 0.59±0.09 | 0.57±0.03 | 0.62±0.03 |
| 40° | 0.66±0.09 | 0.62±0.06 | 0.65±0.06 |
| 50° | 0.73±0.07 | 0.65±0.08 | 0.73±0.03 |
| 60° | 0.78±0.06 | 0.68±0.10 | 0.78±0.03 |
| 70° | 0.78±0.09 | 0.69±0.08 | 0.82±0.05 |
| 80° | 0.79±0.13 | 0.70±0.14 | 0.84±0.09 |
| 90° | 0.72±0.08 | 0.67±0.15 | 0.79±0.13 |
| 100° | 0.66±0.09 | 0.66±0.08 | 0.70±0.08 |
| 110° | 0.61±0.02 | 0.59±0.05 | 0.62±0.09 |
| 120° | 0.68±0.08 | 0.61±0.05 | 0.58±0.04 |
| 130° | 0.70±0.19 | 0.65±0.16 | 0.65±0.09 |

1004

Polarization Classification

| γ/L | 1 | 2 | 3 | 4 |
|---|---|---|---|---|
| 20° | 0.78±0.14 | 0.82±0.12 | 0.87±0.12 | 0.95±0.14 |
| 30° | 0.72±0.14 | 0.76±0.16 | 0.97±0.02 | 0.96±0.15 |
| 40° | 0.72±0.17 | 0.96±0.04 | 0.99±0.01 | 0.98±0.02 |
| 50° | 0.83±0.19 | 0.97±0.04 | 1.00±0.00 | 1.00±0.00 |
| 60° | 0.90±0.10 | 0.97±0.03 | 1.00±0.00 | 1.00±0.00 |
| 70° | 0.92±0.06 | 0.97±0.03 | 0.99±0.01 | 1.00±0.00 |
| 80° | 0.89±0.11 | 0.92±0.08 | 1.00±0.00 | 1.00±0.00 |
| 90° | 0.95±0.05 | 0.96±0.05 | 1.00±0.00 | 1.00±0.00 |
| 100° | 0.97±0.04 | 0.99±0.01 | 1.00±0.00 | 1.00±0.00 |
| 110° | 1.00±0.00 | 1.00±0.00 | 1.00±0.00 | 1.00±0.00 |
| 120° | 1.00±0.00 | 1.00±0.00 | 1.00±0.00 | 1.00±0.00 |
| 130° | 0.96±0.06 | 1.00±0.00 | 1.00±0.00 | 1.00±0.00 |

FIG. 10

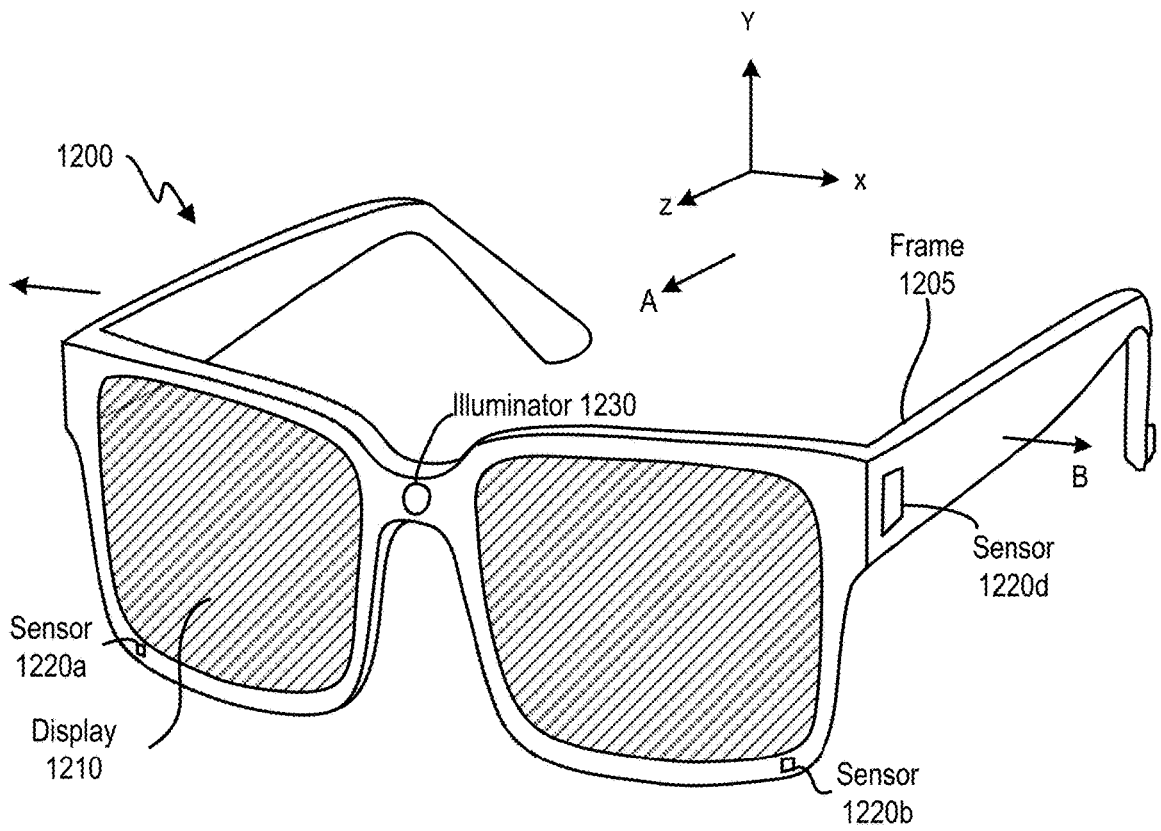
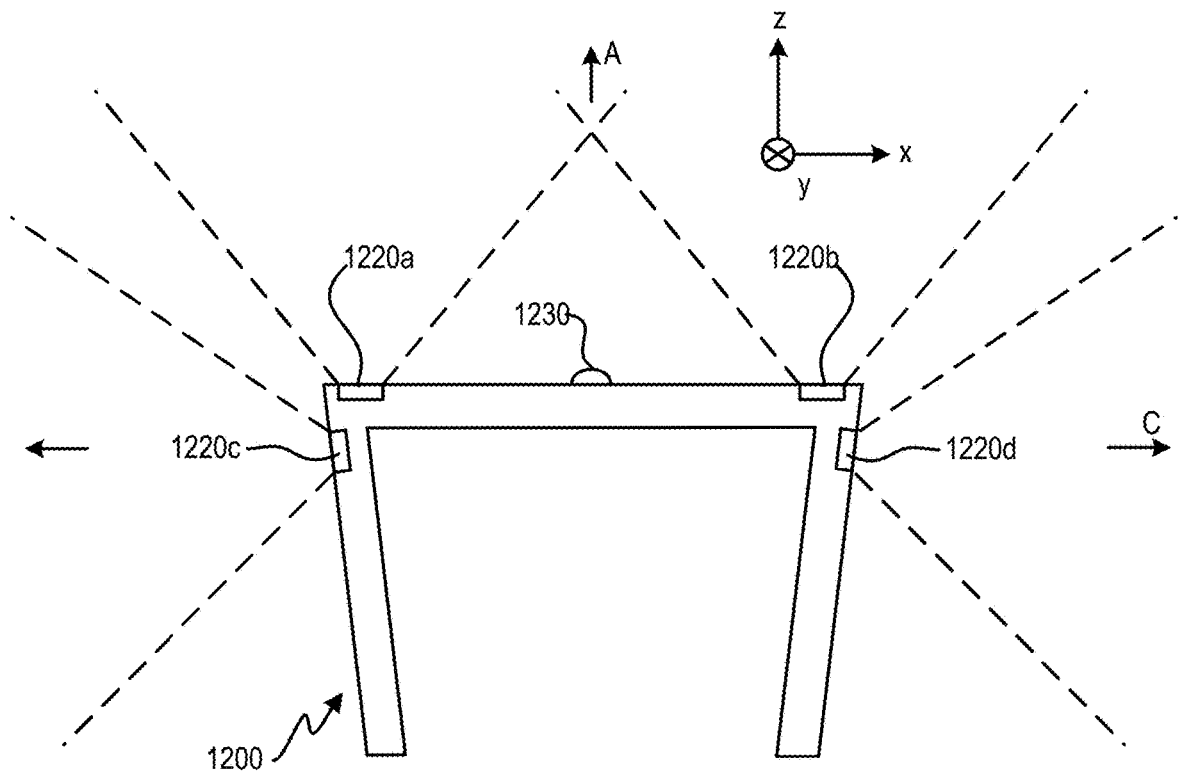
FIG. 12A

POLARIMETRIC IMAGING CAMERA

RELATED APPLICATION

This patent application claims priority to U.S. Provisional Patent Application Ser. No. 63/015,186, filed Apr. 24, 2020, entitled "POLARIMETRIC IMAGING CAMERA," which is assigned to the assignees thereof and is incorporated herein by reference in its entirety for all purposes.

BACKGROUND

Polarimetric imaging allows an image of a scene to be generated that can reveal details that may be difficult to discern or simply not visible in regular monochromatic, color, or infrared (IR) images, which may only rely on measuring intensity or wavelength properties of unpolarized light. By extracting information relating to the polarization of the received light, more insights can potentially be obtained from the scene. For example, a polarimetric image of an object may uncover details such as surface features, shape, shading, and roughness with high contrast. However, polarimetric imaging has mainly been used in scientific settings and required expensive and specialized equipment. Even when such equipment is available, existing techniques for polarimetric imaging can involve time-division or space-division image capture, which can be associated with blurring in either the time or space domain. There exists a significant need for an improved system for polarimetric imaging.

SUMMARY

The present disclosure relates to imaging techniques. More specifically, and without limitation, this disclosure relates to techniques to perform polarimetric imaging.

In some examples, an apparatus is provided. The apparatus comprises: a plurality of sub-pixels arranged sideway along a first axis, each sub-pixel comprising a photodiode configured to convert light energy into a signal; a shared optical element positioned over the plurality of sub-pixels along a second axis perpendicular to the first axis, the shared optical element being configured to direct light originating from a same location in a scene to each sub-pixel in the plurality of sub-pixels; one or more polarizers, each one of the one or more polarizers being positioned over a corresponding one of one or more first sub-pixels along the second axis and configured to selectively pass one or more components of the light having one or more pre-determined polarization states, to enable the photodiodes of each of the one or more first sub-pixels to generate signals based on intensities of the one or more components; and one or more processors configured to generate output values representative of one or more Stokes parameters corresponding to a full or partial Stokes vector characterizing the received light, the output values being generated based on signals obtained from the photodiodes of the one or more first sub-pixels and polarization properties of the one or more polarizers.

In some aspects, the shared optical element comprises a microlens.

In some aspects, the one or more polarizers and the plurality of sub-pixels are built as layers of a multi-layer semiconductor device.

In some aspects, the one or more polarizers comprise one or more linear grids formed using at least one of: a backside metallization (BSM) layer, or deep trench isolation (DTI).

In some aspects, the one or more polarizers comprise at least one elliptical polarizer, the elliptical polarizer comprising at least one of: a linear polarizer, or a linear polarizer and a retarder arranged along the second axis.

In some aspects, the retarder comprises a liquid crystal polymer layer.

In some aspects, the one or more polarizers are built as a pixelated plate of polarizers. The plurality of sub-pixels are built as a semiconductor device. The pixelated plate of polarizers and the semiconductor device are separately fabricated and assembled together.

In some aspects, the signals are first signals. The apparatus further comprises: one or more optical filters positioned between the shared optical element and one or more second sub-pixels of the plurality of sub-pixels along the second axis, the one or more optical filters being configured to selectively pass one or more components of the light of one or more wavelength ranges to the one or more second sub-pixels, to enable the photodiodes of the one or more second sub-pixels to generate second signals based on intensities of the one or more components of the light.

In some aspects, the one or more optical filters comprise at least one of: a red color filter, a green color filter, a blue color filter, or an infra-red filter.

In some aspects, the one or more processors are further configured to: generate a first pixel of a first image of the scene based on the first signals of the one or more first sub-pixels; generate a second pixel of a second image of the scene based on the second signals of the one or more second sub-pixels, the second pixel corresponding to the first pixel; and perform an object detection operation based on the first image and the second image.

In some aspects, at least one of the one or more polarizers and at least one of the one or more optical filters are positioned over at least one second sub-pixel along the second axis.

In some aspects, the one or more optical filters are not positioned over at least one first sub-pixel along the second axis.

In some aspects, the plurality of sub-pixels forms a superpixel. The apparatus comprises an array of superpixels and an array of shared optical elements, the array of superpixels including the superpixel and a plurality of other superpixels, the array of shared optical elements including the shared optical element and a plurality of other shared optical elements. Each shared optical element in the array of shared optical elements is positioned over a corresponding superpixel of the array of superpixels, is shared among a plurality of sub-pixels of the corresponding superpixel, and is configured to direct received light originating from a different location in the scene to the plurality of sub-pixels of the corresponding super-pixel.

In some aspects, the array of superpixels comprises a plurality of unit cells, each unit cell comprising one or more superpixels, the unit cell being replicated multiple times to form the array of superpixels. Each unit cell comprises one of: only one type of superpixel, the one type of superpixel comprising a particular combination of the first sub-pixels overlaid with polarizers, second sub-pixels overlaid with optical filters, or one or more sub-pixels not overlaid with polarizers or optical filters, or different types of superpixels, each of the different types of superpixels comprising a different combination of the first sub-pixels overlaid with polarizers, second sub-pixels overlaid with optical filters, or one or more sub-pixels not overlaid with polarizers or optical filters.

In some aspects, further comprising an illuminator configured to project a light beam toward the scene, wherein the received light comprises light originating from the illuminator and reflecting off of one or more objects in the scene.

In some aspects, the illuminator is configured to transmit light of a known polarization state.

In some aspects, the apparatus further comprises a controller configured to control the photodiodes of the plurality of sub-pixels to sense the light within a same exposure period to generate the signals.

In some examples, a method comprises: receiving, via a shared optical element positioned over a plurality of sub-pixels, light originating from a same location in a scene, each of the plurality of sub-pixels being arranged sideway along a first axis including a photodiode to convert light energy into a signal, the shared optical element being positioned over the plurality of sub-pixels along a second axis; selectively passing, using one or more polarizers positioned between the shared optical element and one or more first sub-pixels of the plurality of sub-pixels along the second axis, one or more components of the light having one or more pre-determined polarization states to the one or more first sub-pixels of a plurality of sub-pixels; generating, using photodiodes of the one or more first sub-pixels, signals based on intensities of the one or more components; and generating, by one or more processors, output values representative of polarimetric measurements of the received light based on the signals obtained from the photodiodes of the one or more first sub-pixels and based on polarization properties of the one or more polarizers.

In some aspects, the output values include more Stokes parameters corresponding to a full or partial Stokes vector characterizing the received light.

In some aspects, the signals are first signals. The method further comprises: selectively passing, using one or more optical filters positioned between the shared optical element and one or more second sub-pixels of the plurality of sub-pixels, one or more components of the light of one or more wavelength ranges to the one or more second sub-pixels of a plurality of sub-pixels to enable the photodiodes of the one or more second sub-pixels to generate second signals based on intensities of the one or more components of the light; generating, by the one or more processors, a first pixel of a first image of the scene based on the first signals of the one or more first sub-pixels; generating, by the one or more processors, a second pixel of a second image of the scene based on the second signals of the one or more second sub-pixels, the second pixel corresponding to the first pixel; and performing, by the one or more processors, an object detection operation based on the first image and the second image.

BRIEF DESCRIPTION OF THE DRAWINGS

Illustrative examples are described with reference to the following figures.

FIG. 3A and FIG. 3B illustrate examples of measures that quantify polarimetric properties of light.

FIG. 5A and FIG. 5B illustrate example techniques to characterize the polarimetric interaction that an object has with light.

FIG. 7A, FIG. 7B, and FIG. 7C illustrate examples of a multi-layer semiconductor sensor device that implements a superpixel to provide both intensity and polarimetric imaging.

FIG. 9 and FIG. 10 illustrate examples of a classification task that can be handled with improved accuracy through the use of polarimetric data, and the outputs of the classification tasks.

FIG. 12A and FIG. 12B illustrate a head mounted device (HMD) in which one or more polarimetric sensor arrays described in the present disclosure can be implemented.

Figure 1A:
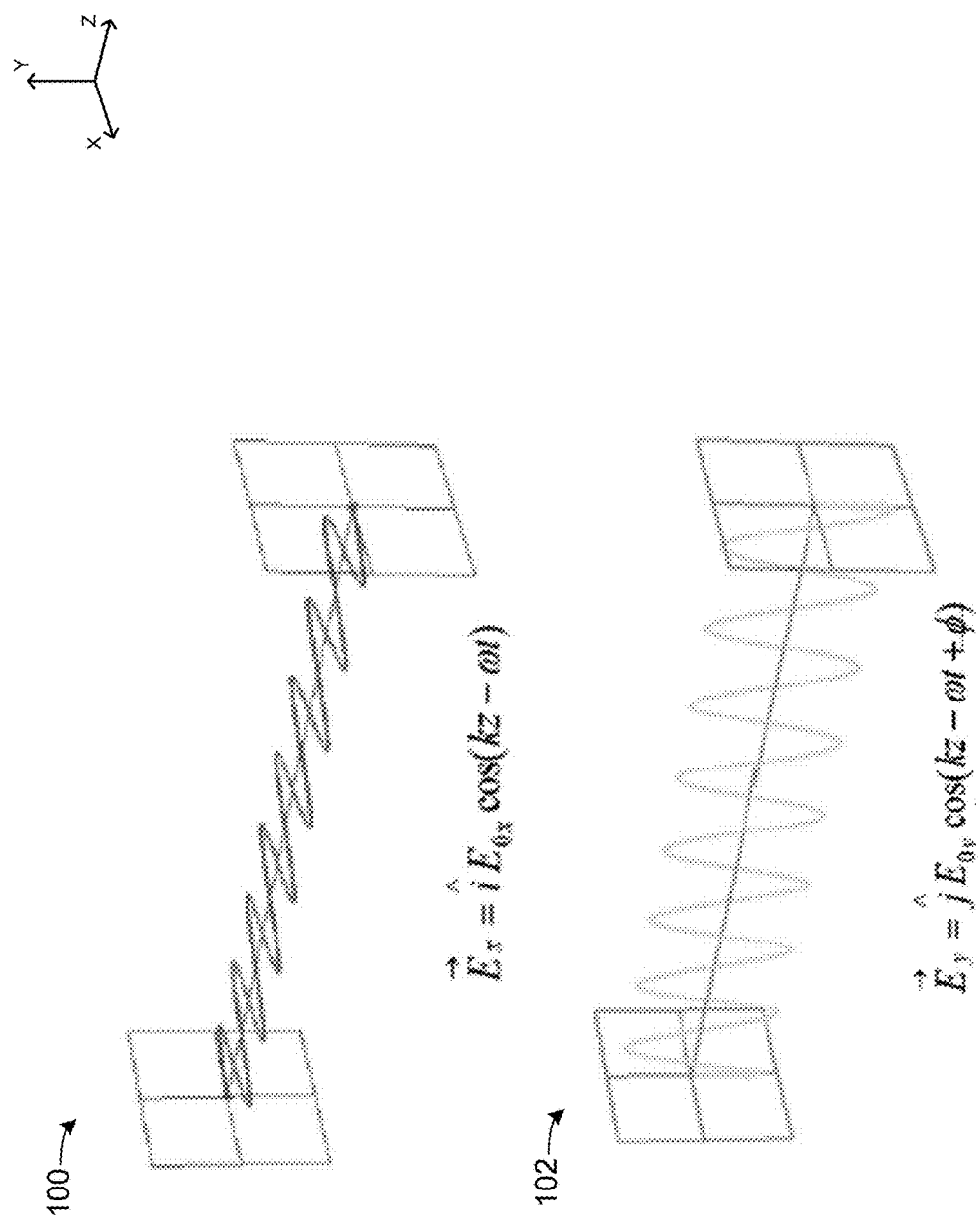
FIG. 1A and FIG. 1B illustrate examples of polarization of light as an electromagnetic transverse wave.

The figures depict examples of the present disclosure for purposes of illustration only. One skilled in the art will readily recognize from the following description that alternative examples of the structures and methods illustrated may be employed without departing from the principles of or benefits touted in this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, for the purposes of explanation, specific details are set forth to provide a thorough understanding of certain inventive examples. However, it will be apparent that various examples may be practiced without these specific details. The figures and description are not intended to be restrictive.

An image sensor can sense light to generate images. The image sensor can sense light of different wavelength ranges from a scene to generate images of different channels (e.g., images captured from light of different wavelength ranges). The images can be processed by an image processor to support different computer vision applications, such as detection and classification of certain objection. The detection/classification results can support other applications, such as VR/AR/MR applications. For example, an image processor can perform an image processing operation on the images to detect an object of interest/target object and its locations in the images. The detection of the target object can be based on detection of a pattern of features of the target object from the images. Based on the detection of the target object, the VR/AR/MR applications can generate output contents (e.g., virtual image data for displaying to the user via a display, audio data for outputting to the user via a speaker, etc.) to provide an interactive experience to the user.

Conventional image sensors utilize unpolarized imaging, relying only on the intensity properties of unpolarized light to support a computer vision application, such as object detection and tracking. For example, object identification/detection can be based on detecting a pre-determined pattern of intensities of light of different wavelengths as features. The performance of unpolarized light imaging, however, can be limited by the operational environment. For examples, when operating in a low ambient light environment, or when the object is obscured (e.g., hidden by shadows, fog, smoke, hazy weather, glare, etc.), it may become difficult to distinguish between different patterns of intensities of unpolarized light with a high fidelity to support an object identification/detection operation.

This disclosure proposes an apparatus, such as an image sensor, that can address at least some of the issues above. The image sensor can generate signals based on sensing polarization of light. Specifically, the apparatus comprises a plurality of photodiodes arranged sideway along a first axis, each photodiode being configured to convert light energy into a signal. The plurality of photodiodes can form a superpixel or a pixel, with each photodiode forming a sub-pixel of the superpixel, such that the pixel comprises a plurality of sub-pixels. The apparatus further includes a shared optical element positioned between a scene and the plurality of photodiodes along a second axis perpendicular to the first axis. The shared optical element is configured to direct received light originating from a same location in the scene to each of the plurality of photodiodes, such that signals generated for the superpixel/pixel represent that location in the scene. In addition, the apparatus includes one or more polarizers positioned between the shared optical element and one or more first sub-pixels selected from the plurality of sub-pixels, each one of the one or more polarizers being positioned over a corresponding one of the one or more first sub-pixels and configured to selectively pass a component of the light having a pre-determined polarization state to the corresponding one of the one or more first sub-pixels.

The apparatus further includes one or more processors configured to generate output values representative of one or more Stokes parameters corresponding to a full or partial Stokes vector characterizing the received light, using signals obtained from photodiodes of the one or more first sub-pixels and polarization properties of the one or more polarizers. In some examples, the one or more processors can also use the Stokes parameters to generate additional parameters, such as degree of linear polarization (DoLP) and angle of linear polarization (AoLP), for the super-pixel. The DoLP and AoLP values for different super-pixels can be used to, for example, detect features of an object.

In some examples, a linear grid structure made of deep trench isolation (DTI) are used to create a linear polarizer to selectively pass a linear polarized component of the light. In some examples, a retarder can also be included with the linear grid to create an elliptical polarizer, to selectively pass a circular polarized component of the light. The measurements using a linear polarizer and an elliptical polarizer can be used by the one or more processors to generate a full set of Stokes parameters.

In some examples, a super-pixel may include sub-pixels for polarization state measurements and sub-pixels for measuring intensities of light of different wavelengths (e.g., red, blue, and green colors, infra-red, etc.), to allow collocated polarization state and intensity measurements. In some examples, features detected based on polarization state and intensity measurements can be combined to perform an object detection operation.

An example imaging system according to the present disclosure can provide polarized light imaging, which can augment unpolarized imaging when such imaging is hindered by the operation condition (e.g., low ambient light environment, or when the object is obscured). Moreover, through the one or more polarizers and the shared optical element, different polarimetric measurements of the received light can be made by the photodiodes for the same location in a scene using the signals of the photodiodes, and the measurements are used to represent that location, which can be a point on an object. Moreover, the photodiodes can have the same exposure period in a global shutter operation, such that the different measurements of the polarization state are based on light received not only from the same location but also within the same time. Compared with a case where different pixels are used to perform different polarization state measurements, which may require the same polarization properties at different spatial locations within the scene, an image sensor according to the present disclosure can provide collocated measurements of polarization states, and/or collocated polarization state and intensity measurements, within a super-pixel. Such arrangements can facilitate the correspondence between the different measurements of the polarization state, or between polarization state and intensity measurements, for the same location. Moreover, the global shutter operation can reduce motion blurring compared with a case where the different measurements of the polarization state are made sequentially based on light received from different exposure periods. All these can improve the performance of the image sensor, as well as the applications (e.g., computer vision applications, VR/AR/MR applications, etc.) that rely on the outputs of the image sensor.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Polarization of Light

Figure 1B:
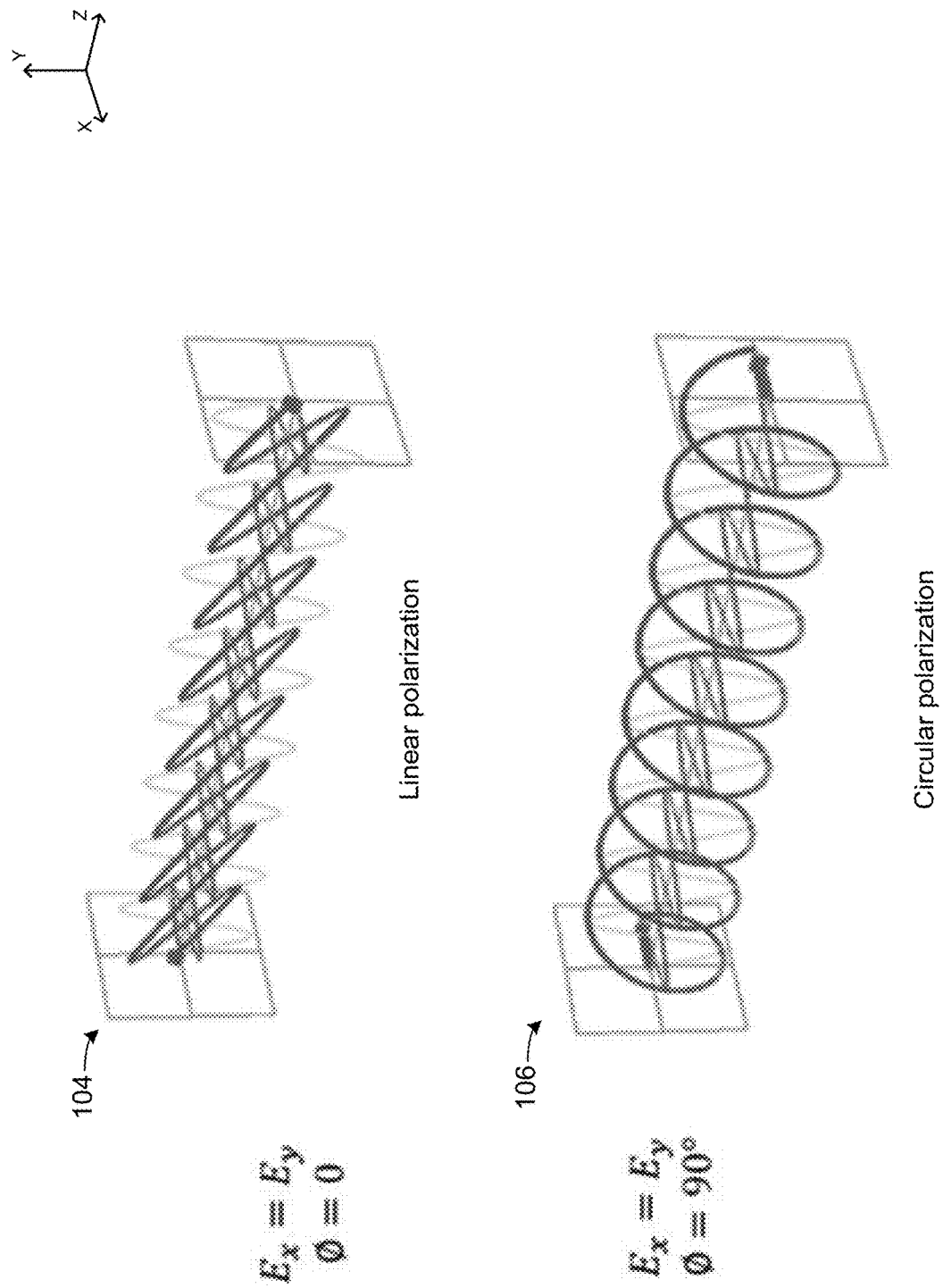

FIG. 1A and FIG. 1B illustrate examples of polarization states of light as an electromagnetic transverse wave traveling along a Z axis. While an electromagnetic wave comprises synchronized oscillations of both an electric and a magnetic field, FIG. 1A and FIG. 1B only show the electric field for ease of illustration. A magnetic field having an orientation perpendicular to the electric field is understood to be present. In FIG. 1A, graph 100 shows the propagation of a "horizontally" polarized electromagnetic wave with oscillations along an X axis. The horizontally polarized wave can be expressed as:

$$\vec{E}_x = \hat{i} E_{ox} \cos(kz - \omega t) \qquad \text{(Equation 1)}$$

Moreover, graph 102 shows a "vertically" polarized electromagnetic wave oscillating along a Y axis. The vertically polarized wave can be expressed as:

$$\vec{E}_Y = \hat{i} E_{oY} \cos(kz - \omega t + \varnothing) \qquad \text{(Equation 2)}$$

In addition, referring to FIG. 1B, diagram 104 shows a linearly polarized electromagnetic wave represented as the combination of the horizontally polarized wave and the vertically polarized wave, with no phase offset between the two waves. Such a linearly polarized electromagnetic wave can be expressed as:

$$\vec{E}_x + \vec{E}_Y, \varnothing = 0 \qquad \text{(Equation 3)}$$

For ease of illustration, the magnitudes of the horizontally polarized wave and vertically polarized wave are presented as being equal, i.e., $E_x = E_y$, which results in a linearly polarized wave oscillating along a 45-degree line between the X axis and the Y axis. If the magnitudes of the horizontally polarized wave and vertically polarized wave were not equal, the resulting linearly polarized wave would oscillate along a line that forms an angle of $\arctan(E_y/E_x)$ relative to the X and Y axes.

Moreover, in FIG. 1B, diagram 106 shows a circularly polarized electromagnetic wave represented as the combination of the horizontally polarized wave and the vertically polarized wave, with a 90-degree phase offset between the two waves. The circularly polarized electromagnetic wave can be expressed as:

$$\vec{E}_x + \vec{E}_Y, \varnothing = 90° \qquad \text{(Equation 4)}$$

More generally speaking, an elliptically polarized electromagnetic wave is generated if a different phase offset is applied. In fact, to be precise, "elliptical" polarization is the most general term used to describe an electromagnetic wave expressed as:

$$\vec{E}_x + \vec{E}_y, \varnothing = X \qquad \text{(Equation 5)}$$

"Linear" polarization can be viewed as a special case of elliptical polarization, with Ø taking on the value of 0. "Circular" polarization can be viewed as a special case of elliptical polarization, with Ø taking on the value of 90 degrees.

Figure 2:
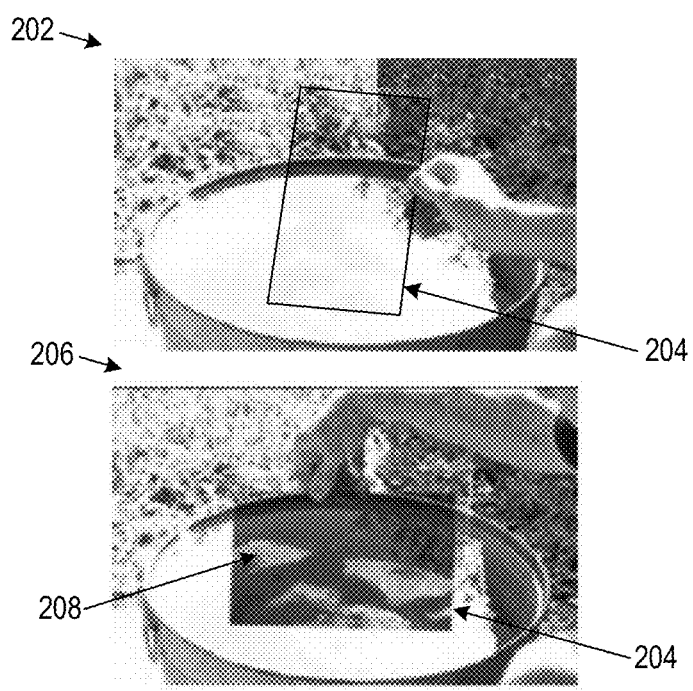
FIG. 2 illustrates examples of the effect of polarizers on light reflecting from different surfaces.

FIG. 2 illustrates examples of the effect of polarizers on light reflecting from different surfaces. In these examples, a viewer observes a scene comprising a vat filled with water, with stones submerged beneath the surface of the water. In diagram 202, a horizontally oriented linear polarizer 204 is placed between the scene and the viewer. Light from the scene passes through the polarizer to reach the eyes of the viewer. The horizontally oriented linear polarizer acts as a filter, to let horizontally polarized light through but filter out vertically polarized light. On a bright day, what the viewer sees from the scene can include light reflecting off of the stones as well as light reflecting off of the surface of the water (i.e., glare). Generally speaking, when light strikes a surface, the reflected light waves are polarized to match the angle of that surface. Thus, a highly reflective horizontal surface, such as the surface of the water, produces predominately horizontally polarized light. As diagram 202 shows, a horizontally oriented polarizer does almost nothing to block the glare (horizontally polarized light) coming off of the surface of the water. The glare is so strong that it is difficult for the viewer to see the light reflecting off of stones submerged beneath the surface of the water.

In diagram 206, polarizer 204 is rotated 90 degrees, such that it is now vertically oriented. The vertically oriented linear polarizer acts as a filter, to let vertically polarized light through but filter out horizontally polarized light. The vertically oriented linear polarizer blocks the glare (horizontally polarized light) coming off of the surface of the water. With the glare removed, the viewer can now see the light reflecting off of stones 208 submerged beneath the surface of the water. In other words, stones 208 are now visible to the viewer.

FIG. 2 thus illustrates examples of operations of polarizers to block light and/or let light pass through, depending on orientation of polarization. While only linear polarizers are illustrated in FIG. 2, other types of polarizers such as circular or elliptical polarizers can also operate to filter light based on its polarization. As to be described below, a polarizer can be implemented in an image sensor to selectively block or let certain light through, which supports various applications such as, for example, low light level imaging under an outdoor or uncontrolled environment, imaging of objects hidden behind water, shadows, fog, smoke or hazy weather, and glare reduction.

Stokes Vector and Mueller Matrix

FIG. 3A and FIG. 3B present polarimetric measurements that can quantify the polarimetric properties/states of light. FIG. 3A shows a definition of the Stokes vector S, which characterizes the polarization state of a beam of light. The stokes vector S consists of four separate Stokes parameters, including an intensity Stokes parameter $S_0$ and three polarization Stokes parameters $S_1$, $S_2$, and $S_3$. Each of the four Stokes parameters can be expressed as a particular combination of one or more of six distinct polarimetric intensity values, which represent six distinct states of polarization (SoPs). The six SoP intensity values include: (1) $I_H$, intensity of the light along the direction of horizontal polarization, (2), $I_V$, intensity of the light along the direction of vertical polarization, (3) $I_{+45}$, intensity of the light along the positive 45-degree linear polarization, (4) $I_{-45}$, intensity of the light along the negative 45-degree linear polarization, (5) $I_{RHC}$, intensity of the light along the right-handed circular polarization, and (6) $I_{LHC}$, intensity of the light along the left-handed circular polarization. These six polarimetric intensity values can be measured as polarimetric measurements and can be expressed as multiplications of various complex amplitudes (and their complex conjugates) of the electromagnetic field of the light along the horizontal and vertical polarization axes. FIG. 3A is reproduced below in Equation 1:

$$S = \begin{pmatrix} S_0 \\ S_1 \\ S_2 \\ S_3 \end{pmatrix} = \begin{pmatrix} I_H + I_V \\ I_H - I_V \\ I_{+45} - I_{-45} \\ I_{RHC} - I_{LHC} \end{pmatrix} = \begin{pmatrix} \langle E_H E_H^* + E_V E_V^* \rangle \\ \langle E_H E_H^* - E_V E_V^* \rangle \\ \langle E_H E_V^* + E_V E_H^* \rangle \\ \langle E_H E_V^* - E_V E_H^* \rangle \end{pmatrix} \qquad \text{(Equation 6)}$$

In Equation 6, the first Stokes parameter, $S_0$, expressed as $I_H + I_V$, is the overall intensity parameter and represents the total intensity of the light. The second Stokes parameter, $S_1$, expressed as $I_H - I_V$, is a measure of the relative strength of the intensity of the light along the horizontal polarization over the vertical polarization. The third Stokes parameter, $S_2$, expressed as $I_{+45}-I_{-45}$, is a measure of the relative strength of the intensity of the light along the positive 45-degree linear polarization over the negative 45-degree linear polarization. The fourth Stokes parameter, $S_3$, expressed as $I_{RHC}-I_{LHC}$, is a measure of the relative strength of the intensity of the light along the right-handed circular polarization over the left-handed circular polarization. There are other representations of the Stokes Vector S and corresponding Stokes parameters $S_0$, $S_1$, $S_2$, and $S_3$. Whatever the format used, the Stokes vector S serves to characterize the polarization state of a beam of light.

FIG. 3B shows different measures of degree of polarization, expressed as functions of various Stokes parameters discussed above. The first measure is the total degree of polarization (DoP), which may be expressed as:

$$DoP = \frac{\sqrt{S_1^2 + S_2^2 + S_3^2}}{S_0} \quad \text{(Equation 7)}$$

In Equation 7, DoP can represent the ratio of the combined magnitude of all three polarization Stokes parameters, $S_1$, $S_2$, and $S_3$, as compared to the magnitude of the intensity Stokes parameter $S_0$.

The next measure is the degree of linear polarization (DoPL), which may be expressed as:

$$DoP_L = \frac{\sqrt{S_1^2 + S_2^2}}{S_0} \quad \text{(Equation 8)}$$

In Equation 8, DoPL can represent the ratio of the combined magnitude of the two linear polarization Stokes parameters, $S_1$ and $S_2$, as compared to the magnitude of the intensity Stokes parameter $S_0$.

Another measure is the degree of circular polarization (DoPc), which may be expressed as:

$$DoP_C = \frac{S_3}{S_0} \quad \text{(Equation 9)}$$

In Equation 9, the DoPc represents the ratio of the magnitude of the circular polarization Stokes parameter, $S_3$, as compared to the magnitude of the intensity Stokes parameter $S_0$.

These different types of "degree of polarization" are useful measures that represent the degree to which the light beam in question is polarized (DoP), linearly polarized (DoPL), or circularly polarized (DoPc).

Figure 4:
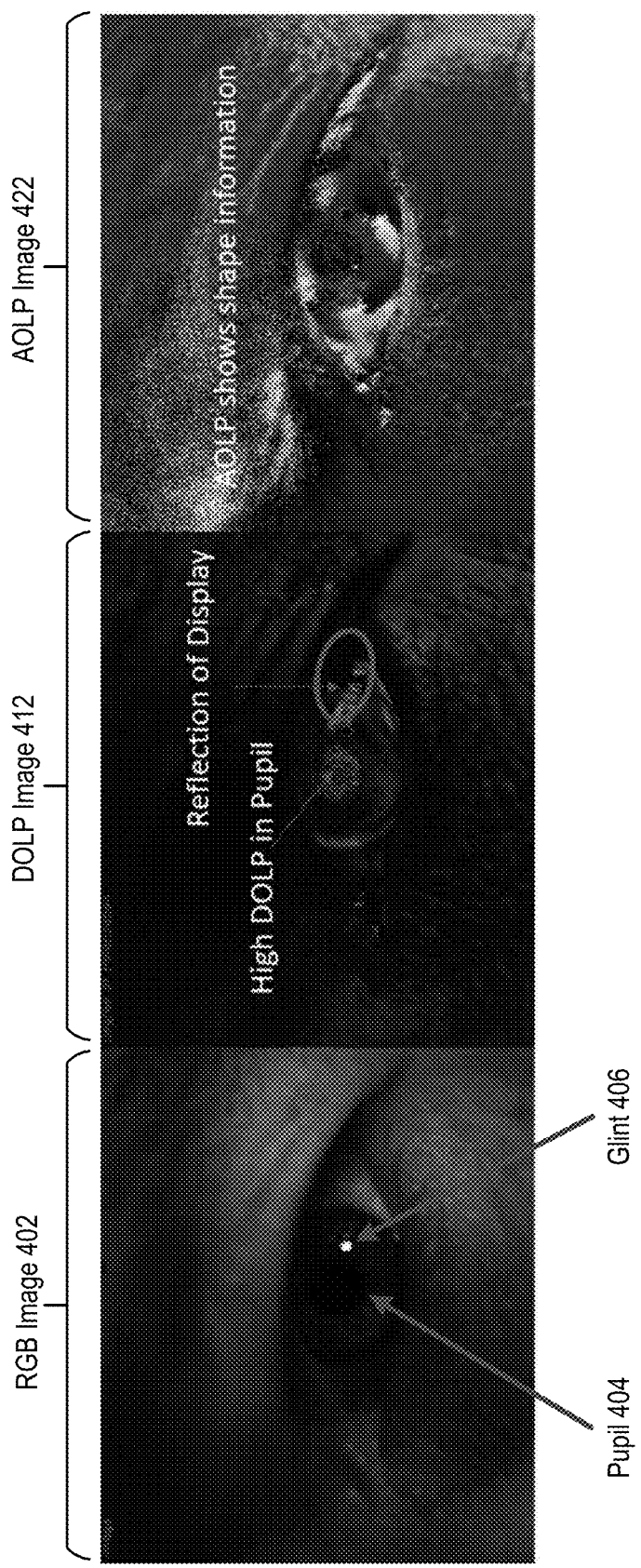
FIG. 4 illustrate examples of different types of images of the same object.

FIG. 4 illustrates examples of images 402 generated based on unpolarized light, as well as images 412 and 422 generated based on polarization properties of received light. Images 402, 412, and 422 are corresponding images captured for the same object—an eye with a pupil and with a glint patch due to reflection of a display. As shown in FIG. 4, image 402 can be a red-green-blue (RGB) image. Such an RGB image is based on intensity of light in each of three wavelength ranges, i.e., wavelength ranges associated with the colors red, green, and blue, respectively. RGB image 402 can be captured by filtering light through a RGB filter array, which can be overlaid on an array of photodiodes of an image sensor, such that different photodiodes of the image sensor can be assigned to collect light of different wavelengths (associated with red, green, and blue lights) to generate red, green, and blue pixel values. RGB image 402 can be reconstructed based on the red, green, and blue pixel values. From RGB image 402, a pupil 404 and a glint 406 can be identified based on features in the red, green, and blue wavelengths.

In addition, image 412 can include a degree of linear polarization (DOLP) image. To generate the pixel values of image 412, Stokes parameters $S_0$ and $S_1$ can be generated based on the outputs of the photodiodes of an image sensor. DOLP for each pixel can be computed based on the following Equation:

$$DOLP = \sqrt{S_1^2 + S_2^2} \quad \text{(Equation 10)}$$

Notice that Equation 10 is slightly different from Equation 8 above. Nevertheless, the DOLP expression provides a representation of the degree to which the light received from the scene is linearly polarized.

In image 412, for each pixel, the value presented in the image is the DOLP value of the light associated with that pixel. A measure of the degree of polarization, such as DOLP, is particularly useful in extracting information regarding reflections of light. Thus, as image 412 illustrates, pupil 404 (which is highly reflective) of the eye, as well as the reflection of a display seen on the surface of the eye that causes glint 406, can have high DOLP values in the image.

In addition, image 422 includes an angle of linear polarization (AOLP) image. Here, the angle of linear polarization can be computed based on Stokes parameters $S_0$ and $S_1$ as the following:

$$AOPL = \arctan(S_2/S_1) \quad \text{(Equation 11)}$$

A measure of the angle of linear polarization is very useful in extracting shape information. As shown in image 422, an AOLP image shows the spherical shape of the eye.

RGB image 402, DOLP image 412, and AOLP image 422 shown in FIG. 4, respectively, demonstrate examples of how various measures of polarization of light can reveal different types of information about a scene, such as different feature patterns of an object. For example, as shown in FIG. 4, RGB image 402, DOLP image 412, and AOLP image 422 can reveal different patterns/types of features of pupil, which allows detection and tracking of the pupil to provide an input to an eye-tracking application. For example, when under a low light condition, the intensity of light received by the photodiodes may be insufficient to enable detection of patterns of features, with high fidelity in the red/blue/green wavelengths from RGB image 402. But the received light intensity is sufficient for detection of regions of high DOLP values in DOLP image 412, and for detection of the eye from AOLP image 422. Therefore, an eye tracking operation can use DOLP image 412 and AOLP image 422 to augment RGB image 402, or even to replace RGB image 402, in the tracking of the position of pupil 404.

FIG. 5A illustrates a Mueller matrix, which characterizes the polarimetric interaction that an object has with light and can be used to reconstruct a polarization image, such as DOLP image 412 and AOLP image 422 of FIG. 4. An input light beam interacts with (e.g., reflects off of or transmits through) an object and results in an output light beam. An input Stokes vector S characterizes the polarization state of the input light beam. A Mueller matrix M characterizes the effect the object has on the polarization state of the light beam. An output Stokes S' vector characterizes the polarization state of the output light beam. This interaction is represented by the equation shown in FIG. 5A, which takes the form of the matrix multiplication:

$$S'=M*S \quad \text{(Equation 12)}$$

In FIG. 5A, input Stokes vector S is a 4×1 vector having 4 elements $S_0$, $S_1$, $S_2$, and $S_3$ (output Stokes parameters). The Muller matrix M is a 4×4 matrix having 16 elements $m_{00}$, $m_{10}$, $m_{20}$, $m_{30}$, $m_{01}$, $m_{11}$, $m_{21}$, $m_{31}$, $m_{02}$, $m_{12}$, $m_{22}$, $m_{32}$, $m_{03}$, $m_{13}$, $m_{23}$, and $m_{33}$ (weights). The output Stokes vector S' is a 4×1 vector having 4 elements $S_0'$, $S_1'$, $S_2'$, and $S_3'$ (output Stokes parameters).

Thus, each element of the output Stokes vector S' is a linear combination of all the elements of the input Stokes vector S. For example, as shown in FIG. 5B, the first element $S_0'$ of the output Stokes vector S' is a linear combination of the four elements $S_0$, $S_1$, $S_2$, and $S_3$ of the input Stokes vector S:

$$S'_0 = m_{00}S_0 + m_{10}S_1 + m_{20}S_2 + m_{30}S_3 \quad \text{(Equation 13)}$$

The elements of the Mueller matrix M provides the "weights" used in such linear combinations. In the example above, the first row of the Mueller matrix provides the weights $m_{00}$, $m_{10}$, $m_{20}$, $m_{30}$, for the linear combination shown in the equation (Equation 13), to generate the first element $S_0'$ of the output Stokes vector S. Each of the other three elements $S_1'$, $S_2'$, and $S_3'$ of the output Stokes vector S can be generated in a similar way, as a linear combination of the four elements $S_0$, $S_1$, $S_2$, and $S_3$ of the input Stokes vector S, with use of the appropriate weights from the corresponding row of the Mueller matrix M. In this manner, the Mueller matrix M fully represents a linear model of how the object interacts with light, to transform the polarization state of the input light beam into the polarization state of the output light beam. The transformation may include selectively passing part of the input light beam of a particular polarization state as the output light beam, and/or changing the polarization state of the polarized input light beam to generate the output light beam.

Polarization images, such as DOLP image 412 and AOLP image 422, can be generated based on Muller Matrix as shown in Equations 7 and Equation 8, as well as Stokes parameters Equation 6. Specifically, the received light can be filtered by one or more polarizers, such as an elliptical polarizer, to selectively pass components of light of different polarization states (e.g., vertical, horizontal, right-handed circular, left-handed circular, etc.), if such components are present. Provided that the Mueller Matrix of the polarizers is known, and that the intensities of light of the different polarization states are measured by the photodiodes to obtain the quantities $I_H+I_V$, $I_H-I_V$, $I_{+45}-I_{-45}$, and $I_{RHC}-I_{LUC}$ for each pixel, the output Stokes parameters $S_0'$, $S_1'$, $S_2'$, and $S_3'$ can be determined based on these quantities and Stokes parameters Equation 6. The input Stokes parameters $S_0$, $S_1$, $S_2$, and $S_3$ for each pixel can then be determined based on Equation 13 and the output Stokes parameters $S_0'$, $S_1'$, $S_2'$, and $S_3'$ for that pixel. DOLP image 412 and AOLP image 422 can then be reconstructed based on input Stokes parameters $S_0$, $S_1$ and Equations 10 and 11.

Super Pixel

Figure 6:
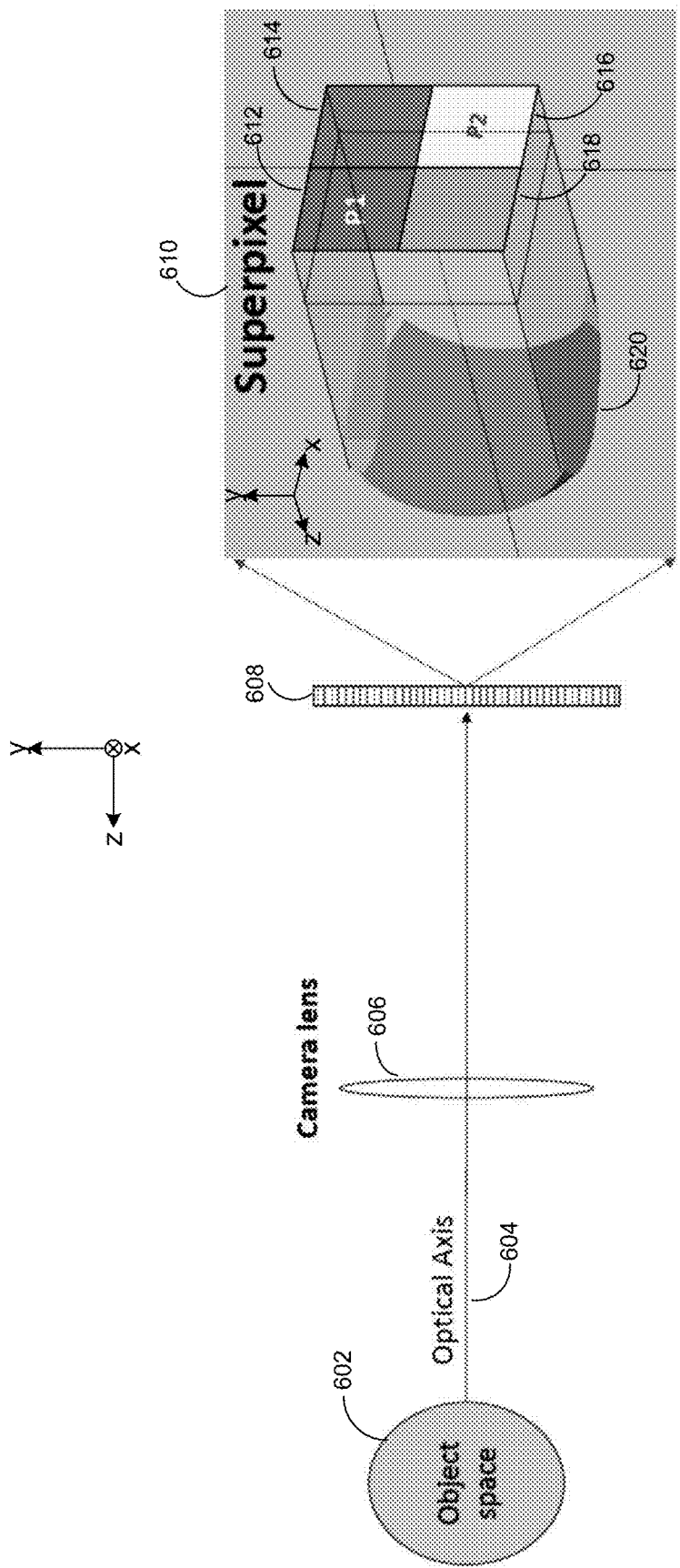
FIG. 6 illustrates an example of an image sensor having superpixels that can implement the disclosed techniques.

FIG. 6 illustrates an arrangement for using "superpixels" to extract wavelength and/or intensity information and polarimetric information from a scene, according to an embodiment of the present disclosure. Light received from a scene such as an object space 602 may travel in a direction along an optical axis 604, through a camera lens 606, and be captured by an array 608 of superpixels. In the present embodiment, the array 608 is a two-dimensional array of superpixels (FIG. 6 shows a side view of the two-dimensional array). Here, each "superpixel" refers to a sensor device that may comprise a plurality of neighboring (i.e., adjacent) sub-pixels, each sub-pixel having a photodiode for converting light energy into a signal. In FIG. 6, the sub-pixels are arranged adjacent to each other along a first axis (e.g., x-axis, y-axis, etc.). FIG. 6 shows an example of such a "superpixel" 610. In the present embodiment, the superpixel 610 comprises four sub-pixels 612, 614, 616, and 618. A different number of sub-pixels per superpixel can be adopted, according to various embodiments.

A shared optical element, such as a microlens 620, may be positioned between the scene and each superpixel 610 along a second axis (e.g., z-axis) perpendicular to the first axis. In some examples, each superpixel may have its own microlens. In some examples, multiple superpixels 610 can share a microlens 620. Microlens 620 may be significantly smaller in size than camera lens 606, which serves to accumulate and direct light for the entire image frame toward the array 608 of superpixels. Micolens 620 is a "shared" optical element, in the sense that it is shared among the sub-pixels 612, 614, 616, and 618 of superpixel 610. Microlens 620 directs light from a particular location in the scene (i.e., a "pixel" within the image frame) to sub-pixels 612, 614, 616, and 618 of superpixel 610. In this manner, the sub-pixels of a superpixel can simultaneously sample light from the same pixel location of the image being captured.

One or more of the sub-pixels of a superpixel may extract wavelength and/or intensity information from the received light for a particular pixel location of the image. As discussed, each sub-pixel may comprise a photodiode. Different color filters may be positioned over one or more of the sub-pixels, with each color filter serving as a filter that allows light of a particular wavelength range to pass through while blocking light outside of that wavelength range. For example, sub-pixel 612 may be covered with a red color filter and thus configured to sense light in a "red" wavelength range. Sub-pixel 614 may be covered with a green filter and thus configured to sense light in a "green" wavelength range. Sub-pixel 616 may be covered with a yellow filter and thus configured to sense light in a "yellow" wavelength range. Sub-pixel 618 may be covered with an infrared (IR) filter and thus configured to sense light in an IR wavelength range. Accordingly, sub-pixels 612, 614, 616, and 618 of superpixel 610 may sense light intensities for different colors/wavelengths of light, for a particular pixel location in the image being captured. Such wavelength/intensity information extracted for each pixel location, when combined for a plurality of pixel locations, can form an image. The array of superpixels can thus be used to form an image such as an RGB image, IR image, etc.

In addition, one or more of the sub-pixels of a superpixel may extract polarimetric information from the received light for a particular pixel location of the image. Different polarizers may be positioned over one or more of the sub-pixels, with each polarizer serving as a filter to allow light of a particular polarization state (e.g., vertical, horizontal, right-handed circular, left-handed circular, etc.) to pass through while blocking light of other polarizations. For example, sub-pixel 612 may be covered with a vertically oriented linear polarizer P1 and thus configured to sense only vertically polarized light to measure polarimetric intensity $I_V$. Sub-pixel 616 may be covered with a horizontally oriented linear polarizer P2 and thus configured to sense only horizontally polarized light to measure polarimetric intensity $I_H$. Thus, sub-pixels 612, 614, 616, and 618 of superpixel 610 can potentially sense light intensities for different polarization states of light, for a particular pixel location in the image being captured. For each pixel location, these different polarimetric intensities may be used to compute polarimetric information such as a full or partial Stokes vector of the received light, one or more values derived from the full or partial Stokes vector (e.g., DOLP, AOLP, etc.), or a combination thereof. Such polarimetric information extracted for each pixel location, when combined for a plurality of pixel locations, can form an image. The array of superpixels can thus be used to form an image such as a DOLP image, AOLP image, etc.

As mentioned above, polarimetric information such as a full or partial Stokes vector may be computed using polarimetric intensities sensed by sub-pixels of a superpixel. Recall from FIG. 5A that the matrix multiplication S'=M*S models the interaction that an object has with light to affect its polarization state. For each sub-pixel (e.g., 612 or 616), an input light beam having a Stokes vector S interacts with an object (i.e., the polarizer positioned over the sub-pixel) characterized by Mueller matrix M, to result in an output light beam having a Stokes vector S', whose intensity is sensed by the photodiode of the sub-pixel. Referring to FIG. 5B, the intensity Stokes parameter $S_0'$ of the output Stokes vector S' may be described by the equation:

$$S'_0 = m_{00}S_0 + m_{10}S_1 + m_{20}S_2 + m_{30}S_3 \quad \text{(Equation 13) (reproduced)}$$

A polarimetric intensity measurement generated by the photodiode of each sub-pixel (e.g., $I_H$, $I_V$, $I_{+45}$, $I_{-45}$, $I_{RHC}$, $I_{LHC}$) can be used to generate output Stokes parameters such as $S_0'$, $S_1'$, $S_2'$, and $S_3'$ for a super-pixel based on Equation 6. With four sub-pixels, each covered by a different polarizer, this generates four instances of Equations 13 for each of output Stokes parameters $S_0'$, $S_1'$, $S_2'$, and $S_3'$. The weights $m_{00}$, $m_{10}$, $m_{20}$, $m_{30}$ of the Mueller matrix are also known, because each polarizer that is used would be well characterized, with its Mueller matrix M being known. What are not known are the values of the Stokes parameters $S_0$, $S_1$, $S_2$, and $S_3$. The four instances of Equation 13 represent four simultaneous equations, which can be used to solve for the four variables $S_0$, $S_1$, $S_2$, and $S_3$. Thus, intensity readings generated from four sub-pixels of a superpixel can support computation of all four Stokes parameters $S_0$, $S_1$, $S_2$, and $S_3$ (i.e., the full Stokes vector S) for a particular pixel location of the image.

Alternatively, to compute a partial Stokes vector, fewer such intensity readings may be needed. In the example shown in FIG. 6, two sub-pixels, 612 and 616, can be covered with linear polarizers. The two sub-pixels produce polarimetric intensity readings $I_H$, $I_V$, $I_{+45}$, and $I_{-45}$, which can be used to compute output Stokes parameters including, for example, $S_0'$, $S_1'$ and $S_2'$. The intensity readings generated from the two sub-pixels provide two simultaneous equations that can be solved to compute the Stokes parameters $S_1$ and $S_2$. As discussed previously, the Stokes parameter $S_1$ is a measure of the relative strength of the intensity of the light along the horizontal polarization over the vertical polarization. The Stokes parameter $S_2$ is a measure of the relative strength of the intensity of the light along the positive 45-degree linear polarization over the negative 45-degree linear polarization, as described previously. Stokes parameter $S_1$ and $S_2$ can be used to compute, for example, DOLP and AOLP values to generate DOLP image 412 and AOLP image 422 of FIG. 4.

Figure 7A:
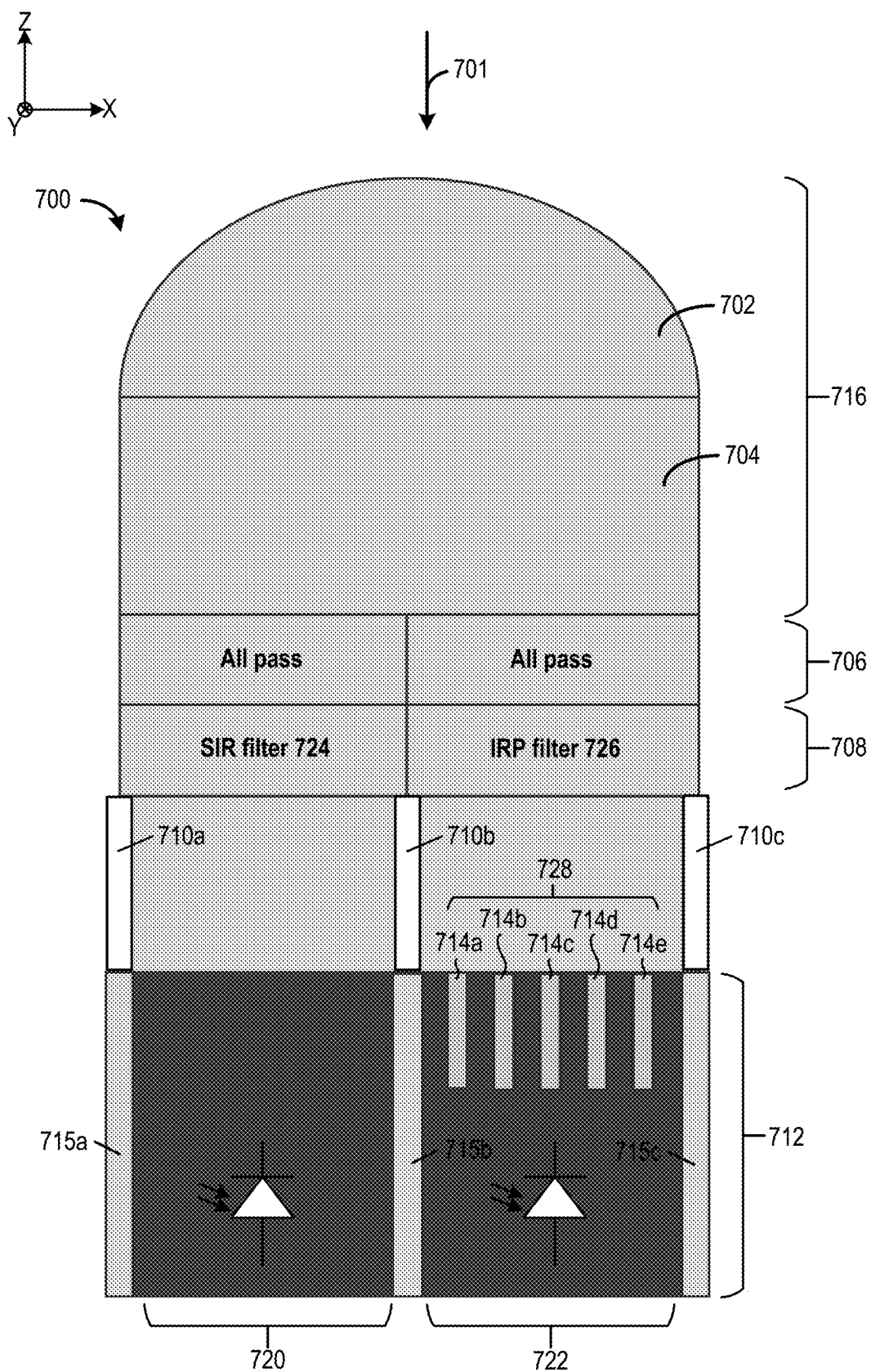

FIG. 7A presents a cross-sectional view of a superpixel implemented as a multi-layer semiconductor sensor device 700 with one or more optical filters to selectively pass light of particular wavelength ranges, and with one or more linear polarizers built into layers over sub-pixels, according to examples of the disclosure. In the orientation shown in this figure, received light 701 travels from the top of device 700, through a microlens and various layers, to reach a plurality of sub-pixels located at the bottom of device 700. The multi-layer semiconductor sensor device 700 comprises multiple layers such as a microlens top layer 702, a microlens underlayer 704, a wavelength filter layer 706, an infrared (IR) filter layer 708, a backside metallization (BSM) layer 710 comprising BSM 701a, 701b, and 701c, and a sub-pixel layer 712. The sub-pixel layer 712 may include a first deep trench isolation (DTI) layer 714 including DTIs 714a, 714b, 714c, 714d, and 714e, and a second DTI layer 715 including DTIs 715a, 715b, and 715c.

The multiple layers of sensor device 700 and devices fabricated therein are all built on a common semiconductor die, using one or more semiconductor processing techniques such as lithography, etching, deposition, chemical mechanical planarization, oxidation, ion implantation, diffusion, etc. This is in contrast to building the layers as separate components, then aligning and assembling the components together in a stack. Such alignment and assembly may cause significant precision and manufacturing defect issues, especially as the physical dimensions of the sensor device is reduced to the scale of single-digit micrometers. The design of the superpixel as a multi-layer semiconductor sensor device 700 allows components such as sub-pixels, wavelength filters, polarization filters, and the microlens to be precisely aligned, as controlled by semiconductor fabrication techniques, and avoids issues of misalignment and imprecision that may be associated with micro assembly.

In some examples, multi-layer semiconductor sensor device 700 comprises a microlens 716. As shown, microlens 716 may comprise a top portion and a bottom portion, formed in the microlens top layer 702 and microlens underlayer 704, respectively. Multi-layer semiconductor sensor device 700 also comprises four sub-pixels, which are arranged in a 2×2 layout (from a top-down view). FIG. 7A presents a cross-sectional view, which makes only two out of the four sub-pixels visible, including a sub-pixel 720 and a sub-pixel 722. Each sub-pixel comprises a photodiode (e.g., represented by photodiode symbols in FIG. 7A) that converts light energy into a signal. Microlens 716 directs received light from a particular pixel location in a scene to the sub-pixels of device 700, including sub-pixel 720 and sub-pixel 722. BSM 710 and DTI 715 can provide insulation and reduce cross-talks between sub-pixels 720 and 722.

Different wavelength filters may be formed over each sub-pixel to control the type of wavelength information extracted by the sub-pixel. Here, a "stop infrared" (SIR) filter 724 is positioned over intensity sub-pixel 720. SIR filter 724 is fabricated within IR filter layer 708. SIR filter 724 blocks light in the infrared (IR) wavelength range and allows light outside the IR wavelength range to pass through to reach intensity sub-pixel 720. An "infrared pass" (IRP) filter 726 is positioned over polarization sub-pixel 722. IRP filter 726 is also fabricated within IR filter layer 708. IRP filter 726 allows light in the IR wavelength range to pass through to reach polarization sub-pixel 722. While not shown in FIG. 7A, color filters such as those in the "red" wavelength range, "green" wavelength range, "yellow" (or "blue") wavelength range, etc., may also be positioned over each sub-pixel. Such color filters may be fabricated in the wavelength filter layer 706. In the current arrangement, the various layers allow all non-IR wavelengths (regardless of color) to pass through and reach sub-pixel 720. The photodiode of sub-pixel 720 can then generate a charge indicative of the intensity of monochromatic light, and the charge can be quantized to measure the intensity of the monochromatic light received by the photodiode. In a case where light 701 is unpolarized, the photodiode of sub-pixel 720 can measure the intensity of unpolarized light. In a case where light 701 is polarized, the photodiode of sub-pixel 720 can measure the intensity of light having the same polarization state as light 701.

In addition, a polarization filter may also be formed over a sub-pixel, such as sub-pixel 722, to pass a part of light 701 having a specific polarization state to sub-pixel 722, such that sub-pixel 722 can detect and measure the intensity of light of that polarization state. The photodiode of polarized sub-pixel 722 can then generate a charge for measuring the intensity of the light having the specific polarization state. In some examples, the linear polarizer may be implemented in the form of grid lines, the grid lines implemented in the form of parallel, three-dimensional "fins" formed using deep trench isolation (DTI) technology in the semiconductor material of a sub-pixel. In FIG. 7A, the vertically oriented linear polarizer 728 is shown as being implemented as such a DTI-formed linear polarizer. The DTI structure is formed in the deep trench isolation layer 714 of the sub-pixel layer 712 of device 700. The parallel, three-dimensional "fins" of the DTI-formed, vertically oriented linear polarizer 728 may have a collimating effect and may be associated with more precise control over the polarization state as a function of the angle of the light as it passes through the polarizer formed using backside metallization over a sub-pixel. In some examples, backside metallization structures, each having a flat, two-dimensional shape, can also be formed to implement linear polarizer 728.

Different types of polarized filter can be formed over the sub-pixel to control the polarization state, which in turn can select the polarimetric intensity (e.g., one of $I_H$, $I_V$, $I_{+45}$, $I_{-45}$, $I_{RHC}$, $I_{LHC}$) measured by the sub-pixel. In FIG. 7A, a vertically oriented linear polarizer 728, in which each grid line (represented by, for example, DTIs 714) runs across sub-pixel 722 along the y-axis. The output of the photodiode of sub-pixel 722 can be used to measure polarimetric intensity $I_V$. FIG. 7B illustrates, in addition to vertical linear polarizer 728, other grid patterns to provide other types of linear polarization. FIG. 7B illustrates a grid pattern that runs across the x-axis to form horizontally oriented linear polarizer 730 to measure polarimetric intensity $I_H$, a grid pattern that runs at −45 degrees with respect to the x-axis to form negative 45-degree linear polarizer 732 to measure polarimetric intensity $I_{+45}$, and a grid pattern that runs at +45 degrees with respect to the x-axis to form positive 45-degree linear polarizer 734 to measure polarimetric intensity $I_{-45}$.

Referring back to FIG. 7A, in some instances, a sub-pixel can be configured to extract both wavelength information as well as polarization information from the receive light. Such is the case for polarization sub-pixel 722. Both the IRP filter 726 and the vertically oriented linear polarizer 728 are positioned over polarization sub-pixel 722. As discussed, IRP filter 726 only allows light in the IR wavelength range to pass through. Vertically oriented linear polarizer 728 only allows vertically oriented linearly polarized light to pass through. Thus, polarization sub-pixel 722 serves to detect IR light that is vertically polarized. The layered structure of multi-layer semiconductor sensor device 700 allows for flexible arrangement of a wide variety of different wavelength filters and/or polarization filters to be positioned over each sub-pixel.

Figure 7C:
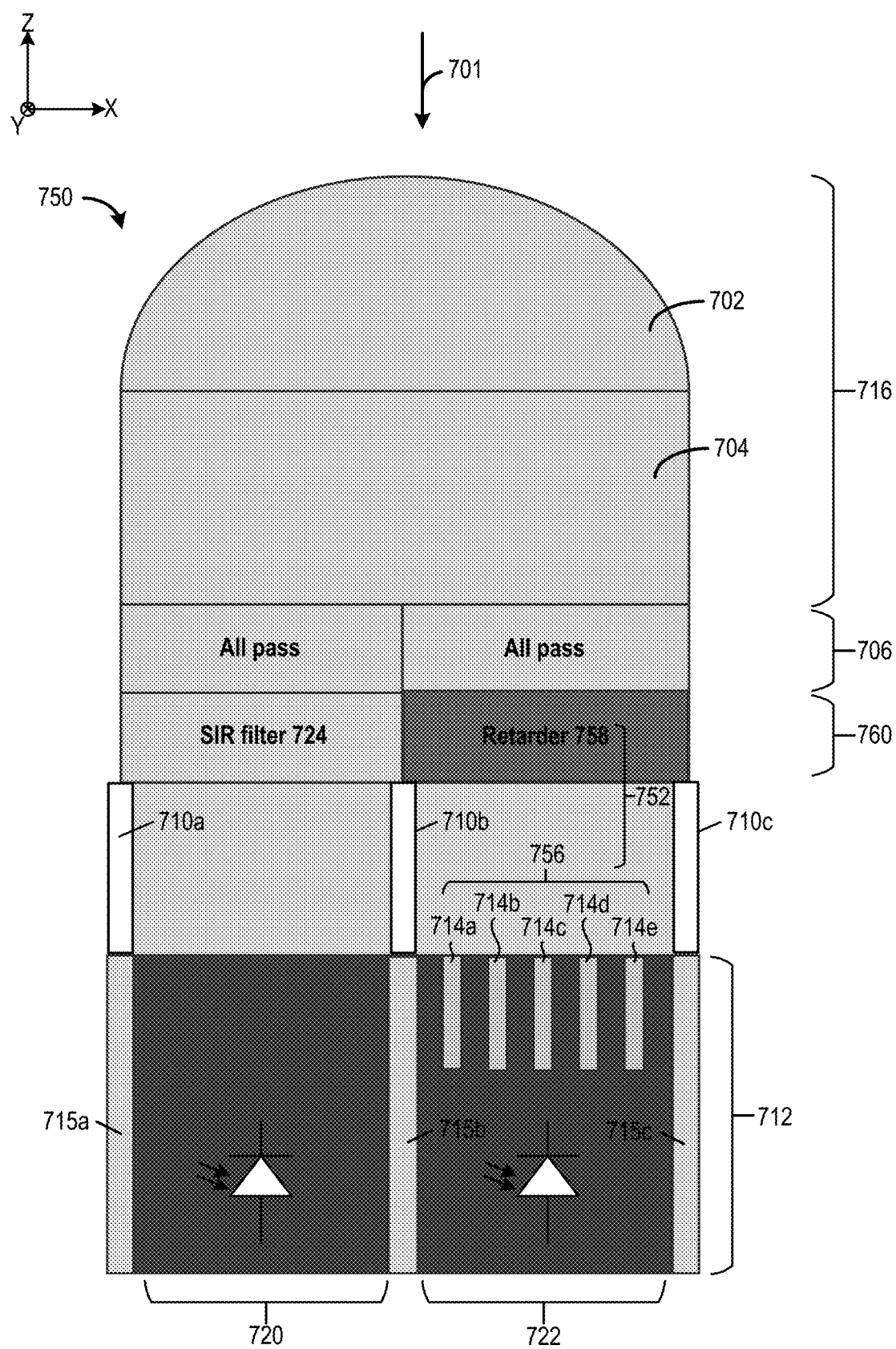

In addition to linear polarizer 728, sensor device 700 may include other types of polarizer, such as an elliptical polarizer to generate circular polarized light. FIG. 7C presents a cross-sectional view of a superpixel implemented as a multi-layer semiconductor sensor device 750 with one or more wavelength filters and one or more elliptical polarizers built into layers over sub-pixels, in some examples of the disclosure. Multi-layer semiconductor sensor device 750 can have similar components as multi-layer semiconductor sensor device 700, shown in FIG. 7A. As such, many of the components and structures that are the same across devices 700 and 750, and their descriptions are not repeated here.

As shown in FIG. 7C, sensor device 750 comprises an elliptical polarizer 752 formed over a polarization sub-pixel 754. An elliptical polarizer can be implemented from the combination of a linear polarizer and a retarder. In FIG. 7C, elliptical polarizer 752 is implemented by combining a vertically oriented linear polarizer 756 (which can be formed with DTI, BSM, etc.) with a retarder 758. In some examples, the retarder 758 is implemented as a quarter wave plate, and the resulting elliptical polarizer is a circular polarizer. Retarder 758 may be formed in one of the wavelength filter layers, such as an infrared (IR) filter layer 760. In some examples, retarder 758 may also comprise a liquid crystal polymer material, in which alignment can be achieved using photo-alignment and/or other techniques. The resulting elliptical polarizer 752 allows elliptically polarized light to pass through to reach polarization sub-pixel 754, to measure polarimetric intensities $I_{RHC}$ and $I_{LHC}$.

In some examples, a superpixel-based sensor may be implemented as an assembly of separately fabricated components. In such examples, the sensor would not be implemented as a multi-layer semiconductor device built on one semiconductor die using semiconductor fabrication techniques, such as in the case of devices 700 and 750. Instead, a sensor device may be assembled from separate components which are aligned and then secured to one another. Just as one example, a superpixel having multiple sub-pixels (e.g., four sub-pixels), each having a photodiode, may be fabricated as a first device. A pixelated plate of polarization filters (e.g., four different polarization filters) may be separately fabricated. The superpixel and the pixelated plate of polarization filters may then be aligned and then secured to one another. Such an alignment process may involve adjustment of the relative positioning of the two components, so that individual sub-pixels of the superpixel are aligned with corresponding polarization filters in the pixelated plate. Color filters may be manufactured on a common semiconductor die as the superpixel. Alternatively, color filters may also be separately fabricated, aligned, and assembled with the superpixel. Additionally, an optical element such as a microlens may also be separately fabricated, aligned, and assembled with the superpixel.

Array of Superpixels and Unit Cell

FIG. 8A-FIG. 8D illustrate a top view of examples of unit cell patterns. Each unit cell can include one or more sub-pixels having one or more types of overlaying polarizers. In some examples, each unit cell can also include one or more sub-pixels having one or more overlaying filters to detect unpolarized light of certain wavelength ranges (e.g., red, green, blue, infra-red, etc.). An image sensor can have an array of unit cells, with each unit cell having the same patterns of polarizer and/or filters. In some examples, a unit cell can span a single superpixel. In FIG. 8A-FIG. 8D, each small square can represent a sub-pixel, while a square with thickened boundary enclosing multiple sub-pixels (e.g., 2×2 sub-pixels) can represent a unit cell.

Figure 8A:
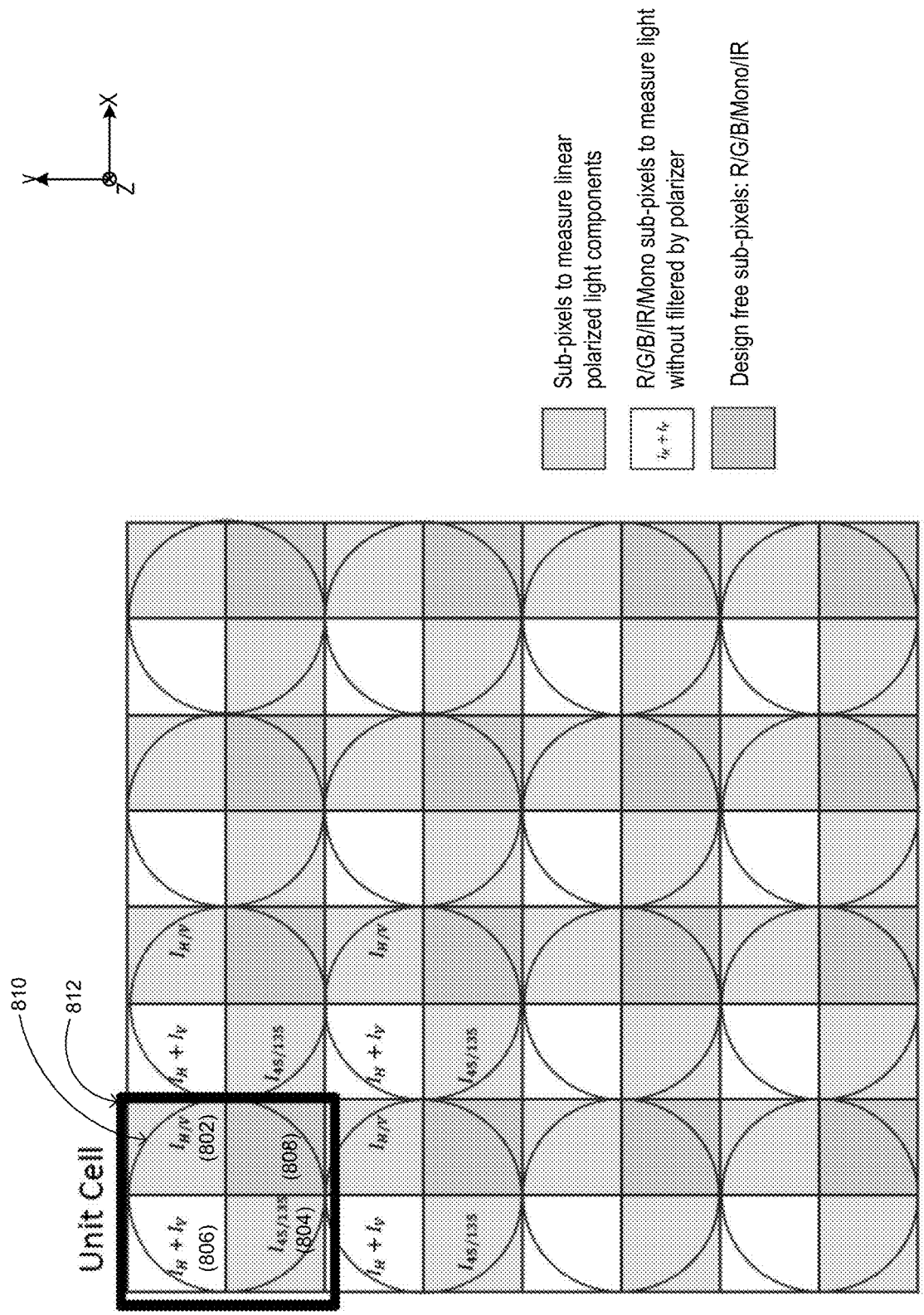
FIG. 8A, FIG. 8B, FIG. 8C, and FIG. 8D illustrate examples of an array of superpixels and unit cells.

FIG. 8A illustrates an example of a unit cell pattern that spans a single superpixel and includes two types of linear polarizers. In FIG. 8A, a legend shows three categories of sub-pixels represented in the particular unit cell pattern: (1) sub-pixels to measure linear polarized light, (2) sub-pixels to measure light without being filtered by a polarizer (R/GB/IR/Mono), and (3) design freedom sub-pixels. Sub-pixel 802 is a linear polarized light sub-pixel denoted as "$I_{H/V}$" which represents that sub-pixel 802 may be overlaid with either a vertically oriented or horizontally oriented linear polarizer to pass light having a vertical or horizontal polarization state, to measure polarimetric intensities $I_H$ or $I_V$. Sub-pixel 804 is a linear polarized light sub-pixel denoted as "$I_{45/135}$" which represents that sub-pixel 804 may be overlaid with either a +45 degree or 135 degree (−45 degree) linear polarizer to measure polarimetric intensities $I_{45}$ or $I_{-45}$. Based on the outputs of sub-pixels 802 and 804, Stokes parameters $S_0$, $S_1$, and $S_2$ for a super-pixel including sub-pixels 802 and 804 can be determined.

In addition, sub-pixel 806 can be a sub-pixel that receives light without being filtered based on polarization state and is denoted as "$I_H+I_V$," which represents that sub-pixel 806 may measure the total power of the received light. Further, sub-pixel 808 can be a design freedom sub-pixel. In some examples, a design freedom sub-pixel can be implemented as any type of unpolarized light sub-pixel such as, for example, sub-pixels for sensing light of a particular wavelength range such as red, green, blue, monochromatic, or IR.

As discussed above, a superpixel comprises a plurality of sub-pixels that receive light from a shared optical element (e.g., a microlens). Here, a superpixel comprises sub-pixels 802, 804, 806, and 808. A circular spot beam 810 represents the illumination footprint of the light beam directed from the shared optical element of the superpixel. Thus, sub-pixels 802, 804, 806, and 808 can simultaneously sample light from the same "pixel" location of the image being captured. The sensor array shown in FIG. 8A may be implemented as an array of superpixels.

As described above, a unit cell can include a collection of one or more superpixels. A unit cell may be replicated multiple times to form the sensor array. In other words, a unit cell can be conceptualized as the smallest unit/pattern of sub-pixels that, if replicated, forms the overall sensor array. In the example shown in FIG. 8A, a unit cell 812 comprises one superpixel (corresponding to circular spot beam 810). As can be seen, unit cell 812 is replicated 16 times to form the portion of the sensor array shown in FIG. 8A, where the entire sensor array may include additional unit cells.

The design of the particular unit cell pattern shown in FIG. 8A has certain notable attributes:
- Linear SoPs fused into pixel co-located imaging
- Essentially a spatial multiplexing sensing method
- Grey pixels are design freedom pixels: R/G/B/Mono/IR
- In this case, $I_{H/V}$ is either a horizontal or vertical polarizer sub-pixel, and $I_{45/135}$ is either a 45 or 135 degree polarizer sub-pixel
- $I_H+I_V$ gives total power (or at least no filtering based on polarization state)
- Enough information to solve for $S_0$, $S_1$, and $S_2$
- Configuration enables 2 modalities: RGB+IR Stokes, Mono Stokes+RGB, IR Stokes+Mono, etc.

These attributes are described in more detail below. Different linear states of polarization (SoPs) are grouped together and exposed to one spot beam 810 of a superpixel. Multiple SoPs are generated for the same "pixel" location of the image being captured. This can be conceptualized as a spatial multiplexing sensing technique, by which multiple sub-pixels sample light from the same location in the scene. The three specified types of sub-pixels (i.e., $I_{H/V}$, $I_{45/135}$, and $I_H+I_V$) may provide enough information to solve for $S_0$, $S_1$, and $S_2$ to generate a partial Stokes vector. Also, the design of this unit cell enables collection of two modalities of information: (1) wavelength/intensity information+(2) polarimetry information. Different combinations of the two modalities of information collected are possible. One potential combination is (1) RGB+(2) IR Stokes. Here, "RGB" refers to a sub-pixel that collects color intensity information. "IR Stokes" refers to a sub-pixel that collects infrared (IR) intensity information, as well as polarimetric information. An example of an IR Stokes sub-pixel is the polarization sub-pixel 722 described previously and shown in FIG. 7A. Another possible combination of two modalities of information collected is (1) Mono Stokes+(2) RGB. "Mono Stokes" refers to a sub-pixel that collects monochromatic intensity information, as well as polarimetric information. Yet another combination of two modalities of information collected is (1) IR Stokes+(2) Mono. "Mono" refers to a sub-pixel that collects only monochromatic unpolarized light intensity information and no polarimetric information. The above are merely illustrative examples, and other combinations are possible.

Figure 8B:
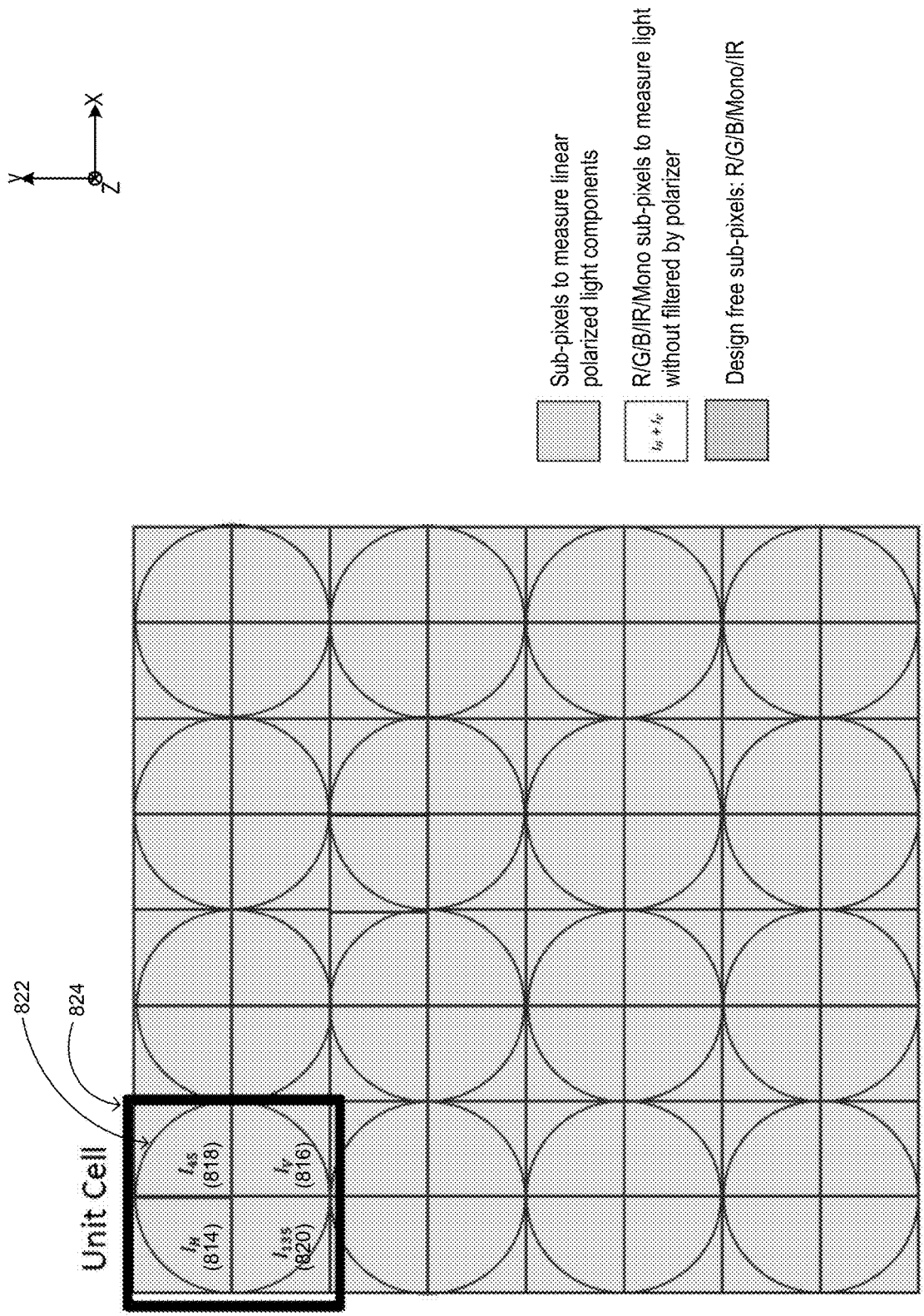

FIG. 8B illustrates a unit cell pattern that spans a single superpixel and includes four types of linear polarizers, according to examples of the disclosure. A legend shows three categories of sub-pixels represented in the particular unit cell pattern: (1) sub-pixels to measure linear polarized light, (2) sub-pixels to measure light without being filtered by a polarizer (R/GB/IR/Mono), and (3) design freedom sub-pixels. In FIG. 8B, only linear polarized light sub-pixels are represented. These include four different linear polarized light sub-pixels: $I_H$ sub-pixel 814, $I_V$ sub-pixel 816, $H_{45}$ sub-pixel 818, and $I_{135}$ sub-pixel 820. A superpixel comprises the sub-pixels 814, 816, 818, and 820. A circular spot beam 822 represents the illumination footprint of the light beam directed from the shared optical element of the superpixel. Thus, sub-pixels 814, 816, 818, and 820 can simultaneously sample light from the same "pixel" location of the image being captured. Here, a unit cell 824 comprises one superpixel (corresponding to the circular spot beam 822). Unit cell 824 is replicated 16 times to form the portion of the sensor array shown in FIG. 8B, where the entire sensor array may include additional unit cells.

The design of the particular unit cell pattern shown in FIG. 8B has certain notable attributes:
- Linear SoPs fused into pixel co-located imaging
- Essentially a spatial multiplexing sensing method
- No design degree of freedom sub-pixels
- 4 measurements to estimate 2 linear Stokes parameters and can take Max ($I_H+I_V$, $I_{45}+I_{135}$) to get $S_0$
- Enough information to solve for $S_0$, $S_1$, and $S_2$
- Advantage is very accurate Stokes measurement but for a single modality Some of these attributes are similar to those presented previously for the design shown in FIG. 8A, and such details are not repeated here. One significant difference, however, is that the unit cell pattern shown in FIG. 8B leaves no room for any degree-of-freedom sub-pixels. Also, while this design also provides sufficient information to solve for the same Stokes parameters $S_0$, $S_1$, and $S_2$, four measurements (compared with two measurements in FIG. 8A) are used to estimate the two linear Stokes parameters $S_1$ and $S_2$. The intensity Stokes parameter $S_0$ may be estimated as the maximum function:

$$S_0 = \text{Max}+(I_H+I_V, I_{45}+I_{135}) \qquad \text{(Equation 14)}$$

With the additional constraints placed on the computation, estimates of the Stokes parameters $S_0$, $S_1$, and $S_2$ can become more accurate. While not shown here, optional color filters can be added to one or more of the sub-pixels 814, 816, 818, and 820, to enable wavelength-based measurements (e.g., R/G/B) as well as polarimetric measurements. An example of such addition of color filters is described in more detail below with respect to FIG. 8D.

Figure 8C:
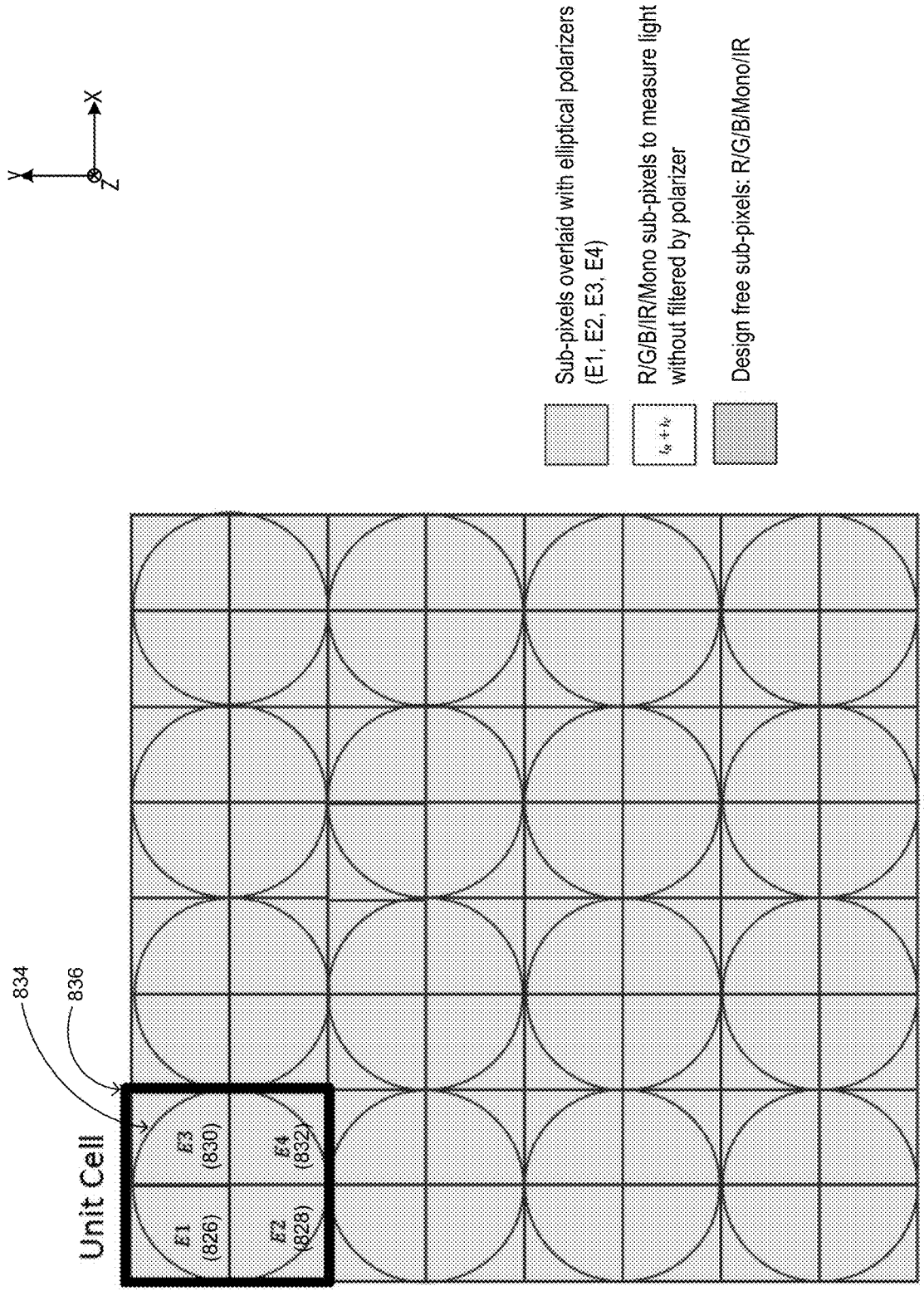

FIG. 8C illustrates a unit cell pattern that spans a single superpixel and includes four types of elliptical polarizers, according to examples of the disclosure. A legend shows three possible categories of sub-pixels: (1) sub-pixels having elliptical polarizer ($E_1$, $E_2$, $E_3$, and $E_4$), (2) sub-pixels to measure light without being filtered by a polarizer (R/GB/IR/Mono), and (3) design freedom sub-pixels. However, as can be seen in FIG. 8C, only elliptical polarization sub-pixels are represented: $E_1$ sub-pixel 826, $E_2$ sub-pixel 828, $E_3$ sub-pixel 830, and $E_4$ sub-pixel 832. A superpixel comprises sub-pixels 826, 828, 830, and 832. A circular spot beam 834 represents the illumination footprint of the light beam directed from the shared optical element of the superpixel. Thus, sub-pixels 826, 828, 830, and 832 can simultaneously sample light from the same "pixel" location of the image being captured. Here, a unit cell 836 comprises one superpixel (corresponding to the circular spot beam 934). Unit cell 836 is replicated 16 times to form the portion of the sensor array shown in FIG. 8C, where the entire sensor array may include additional unit cells).

As mentioned previously, "elliptical" polarization may refer to an electromagnetic wave expressed as: $\vec{E}_x + \vec{E}_y$, $\emptyset = X$. "Linear" polarization can be viewed as a special case of elliptical polarization, with $\emptyset$ taking on the value of 0. "Circular" polarization can be viewed as a special case of elliptical polarization, with $\emptyset$ taking on the value of 90 degrees. Thus, in FIG. 8C (and later in FIG. 8D), each elliptical polarizer shown refers to a polarizer generally. Examples of the elliptical polarizers may correspond to linear polarizers ($\emptyset=0$), circular polarizers ($\emptyset=90°$), elliptical polarizers that are neither linear nor circular (i.e., $\emptyset \neq 0$, $\emptyset \neq 90°$), or a combination of these different types of polarizers.

The design of the particular unit cell pattern shown in FIG. 8C has certain notable attributes:
  Elliptical SoPs fused into pixel co-located imaging
  Essentially a spatial multiplexing sensing method
  The elliptical polarizers are designed to allow reconstruction of the full Stokes vector
  There are at least two options for making an elliptical polarizer using DTI. Option 1 is to use DTI process to integrate metasurfaces at the pixels that create an elliptical polarization response
  The other option is to use the DTI process to create a linear polarizer and place retarders of different orientations at the filters—these can be manufactured using photoaligned liquid crystal polymers, as shown in FIG. 7C
  This configuration allows for a single modality These attributes are described in more detail below. Different elliptical states of polarization (SoPs) are grouped together and exposed to one spot beam 834 of a superpixel. Multiple SoPs are generated for the same "pixel" location of the image being captured. The four elliptical polarized light sub-pixels ($E_1$, $E_2$, $E_3$, and $E_4$) provide enough information to solve for all four Stokes parameters $S_0$, $S_1$, $S_2$, and $S_3$, to generate a full Stokes vector, in a case where the sub-pixels provide polarimetric intensity measurements of $I_H$, $I_V$, $I_{+45}$, $I_{-45}$, $I_{RHC}$, $I_{LHC}$. Deep trench isolation (DTI) techniques may be used to construct an elliptical polarizer. In some examples, DTI is used to integrate metasurfaces—i.e., surfaces having sub-wavelength thickness —to create an elliptical polarization response. This can be done in the semiconductor material of the sub-pixel. In some examples, the elliptical polarizer is constructed from two separate components: (1) a linear polarizer formed using, for example, DTI and/or BSM in the semiconductor material of the sub-pixel and (2) a retarder, e.g., as formed using photoaligned liquid crystal polymers. The retarder may be formed at a wavelength filter layer over the sub-pixel. An example is shown in FIG. 7C and corresponds to linear polarizer 756 formed using DTI and retarder 758 formed using liquid crystal polymers.

Figure 8D:
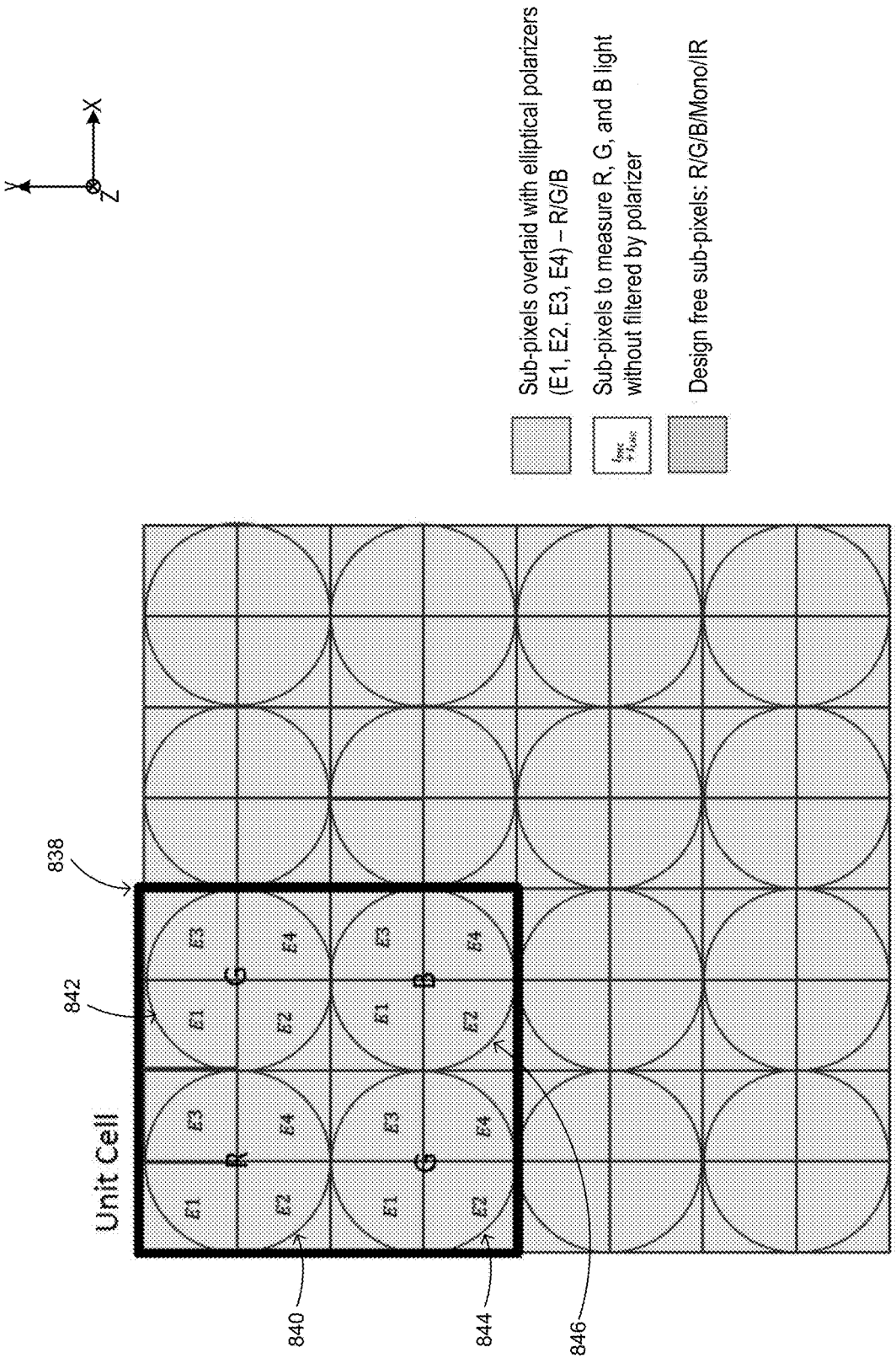

FIG. 8D illustrates a unit cell pattern that spans four superpixels and includes four types of elliptical polarizers, according to examples of the disclosure. A legend shows three possible categories of sub-pixels: (1) sub-pixels to measure linear polarized light, (2) sub-pixels to measure components of visible light without being filtered by a polarizer (R/GB), and (3) design freedom sub-pixels. However, as can be seen in FIG. 8D, only elliptical polarized light sub-pixels having R/G/B color filters are represented. Once again, there are no intensity sub-pixels or design freedom sub-pixels.

The design shown in FIG. 8D differs from the designs shown in FIG. 8C in a few notable ways. For one thing, each unit cell comprises multiple superpixels. For example, unit cell 838 comprises four superpixels, which correspond to respective circular spot beams 840, 842, 844, and 846. Each superpixel still has a similar structure as discussed previously. Here, each super pixel comprises four elliptical sub-pixels $E_1$, $E_2$, $E_3$, and $E_4$. Each circular spot beam represents the illumination footprint of the light beam directed from the shared optical element. Thus, the four elliptical sub-pixels $E_1$, $E_2$, $E_3$, and $E_4$ of each superpixel can simultaneously sample light from the same "pixel" location of the image being captured. However, unlike in FIG. 8C, the elliptical sub-pixels in FIG. 8D additionally include a color filter, to isolate light of a chosen color, such as red, green, and blue (R/GB).

The design of the particular unit cell pattern shown in FIG. 8D has certain notable attributes:
  Elliptical SoPs fused into pixel co-located imaging
  Essentially a spatial multiplexing sensing method
  The elliptical polarizers are designed to allow reconstruction of the full Stokes vector
  This configuration allows for multiple modalities
  But the R/G/B measurement is separated and spans across four superpixels In the examples of FIG. 8A-FIG. 8C, a superpixel (or a unit cell) can have sub-pixels each overlaid with a different polarizer. Each sub-pixel within a superpixel, and each superpixel within an array of superpixels of an image sensor, can also be operated to capture light within the same exposure period, to perform a global shutter operation. Such arrangements allow collocated measurement of different polarimetric intensities from the same point in the scene and within the same exposure period by each superpixel, so that multiple polarization measurements can be performed for the same spot and in a single exposure period. As described above, such arrangements can improve the spatial resolution, as each pixel in the polarimetric image can be generated based on measurements made within a corresponding super-pixel rather than across multiple super-pixels. Such arrangements can also improve the global shutter operation, which can reduce motion blurring especially when imaging an object moving at a high speed.

Example Application: Classification Based on Polarimetry

Figure 9:
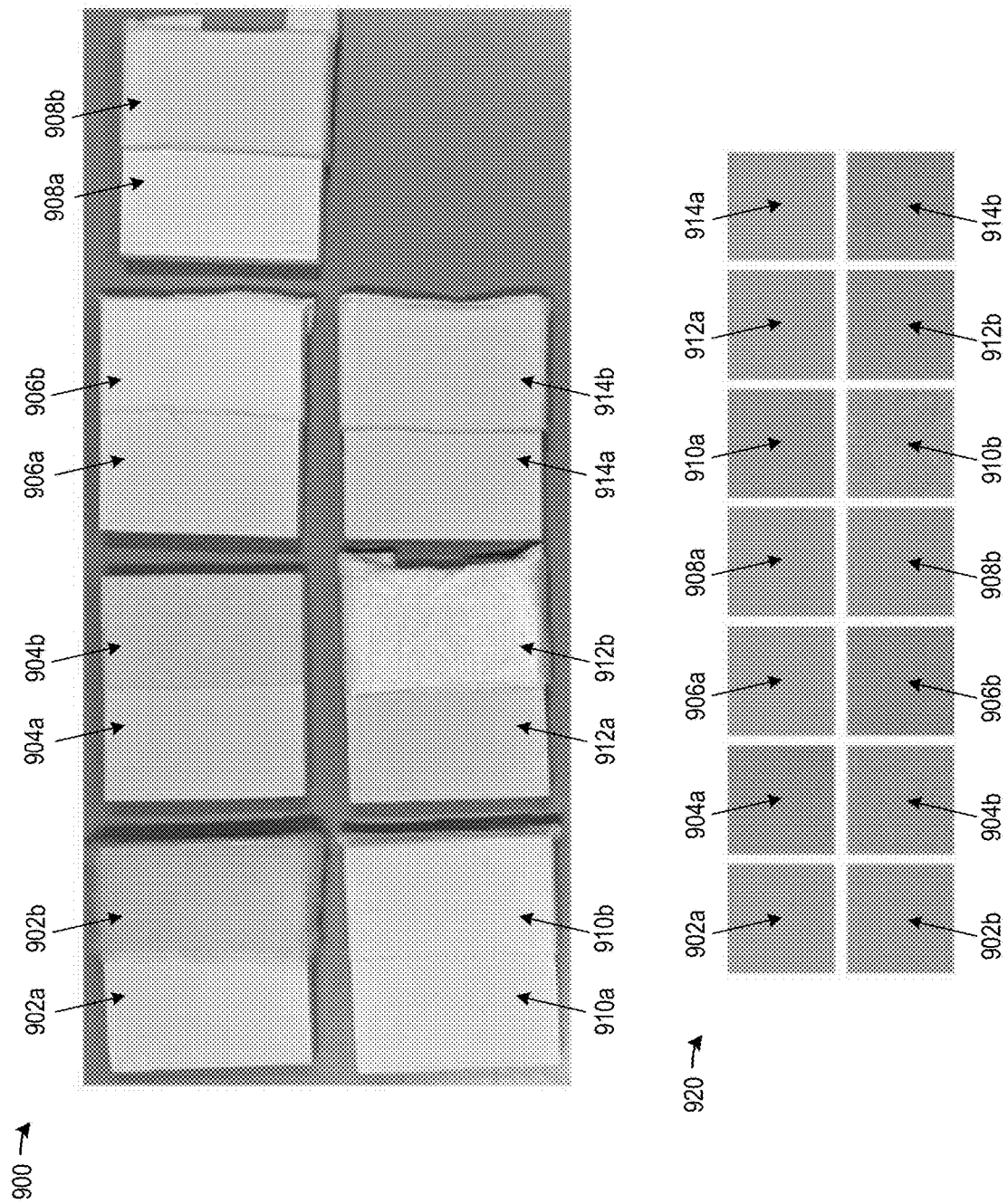

FIG. 9 illustrates an example of a classification task that can be handled with improved accuracy through the use of polarimetric data, according to examples of the present disclosure. Diagram 900 presents an R/G/B image of 7 pairs of material samples having similar optical appearances, including samples 902, 904, 906, 908, 910, 912, and 914. Each pair of material samples consists of: (1) a piece of beige-color wood (samples 902a, 904a, 906a, 908a, 910a, 912a, and 914a) and (2) a piece of beige-colored fabric (samples 902b, 904b, 906b, 908b, 910b, 912b, and 914b). Thus, there is a total of 14 material samples, which consists of 7 beige-colored wood samples and 7 beige-colored fabric samples. Diagram 920 presents R/G/B images of the same 14 material samples, but without contextual information such as the background, edges of each sample, shadows cast by each sample, etc. The 14 material samples are arranged in an array having two rows and seven columns. The top row consists of the 7 beige-colored wood samples 902a, 904a, 906a, 908a, 910a, 912a, and 914a. The bottom row consists of the 7 beige colored fabric samples 902b, 904b, 906b, 908b, 910b, 912b, and 914b. As can be seen in FIG. 9, it may be difficult to distinguish the wood samples from the fabric samples based on the R/G/B images, because the samples all have the same basic color (beige).

FIG. 10 presents the performance outcomes of different classification results between wood and fabric samples by an RGB classifier and by a polarization classifier. An RGB classifier may be trained using machine learning (ML) techniques and a training data set comprising known RGB images—i.e., RGB images known to be taken of either a beige colored wood sample or a beige colored fabric sample. Once trained, the RGB classifier is used on a collection of test RGB images, to attempt to accurately identify each test RGB image as either being that of a beige colored wood sample or a beige colored fabric sample.

Table 1002 shows a table containing the accuracy and precision performance of such an RGB classifier. Each row of the table corresponds to a different scattering angle γ (i.e., 20°, 30°, 40°, . . . , 130°). Each column of the table corresponds to a different wavelength λ, (i.e., 451 nm, 524 nm, and 662 nm). Every entry in the table comprises a performance value for the corresponding scattering angle and wavelength. Each performance value comprises two numbers: (1) a probability of the RGB classifier reaching the correct outcome (e.g., 0.59) and a (2) a precision/deviation amount (e.g., ±0.05). As can be seen from the table, the RGB classifier only achieves mediocre to poor performance. For certain wavelengths and scattering angles, the performance of the RGB classifier in terms of probability of correct outcome is barely over 0.5, which means it does not perform much better than a random coin toss.

Another classification technique is to use a polarization classifier to classify between wood and fabric samples. A polarization classifier may be trained using machine learning (ML) techniques and a training data set comprising known polarization images—i.e., polarization images known to be taken of either a beige colored wood sample or a beige colored fabric sample. Once trained, the polarization classifier is used on a collection of test polarization images, to attempt to accurately identify each test polarization images as either being that of a beige colored wood sample or a beige colored fabric sample. Table 1004 shows a table containing the accuracy and precision performance of such a polarization classifier. Each row of the table corresponds to a different scattering angle γ (i.e., 20°, 30°, 40°, . . . , 130°). Each column of the table corresponds to a different number of polarization measurements associated with the polarization image (i.e., 1, 2, 3, or 4). Referring back to FIG. 5A and FIG. 5B, the number of polarization measurements can indicate how many of the Stokes parameters $S_0$, $S_1$, $S_2$, and $S_3$ can be solved using the full Mueller Matrix Relationship. The number of measurements can be based on, for example, how many of the polarimetric intensities $I_H$, $I_V$, $I_{+45}$, $I_{-45}$, $I_{RHC}$, $I_{LHC}$ are measured by the image sensor.

Every entry in table 1004 comprises a performance value for the corresponding scattering angle and number of polarization measurements. Each performance value comprises two numbers: (1) a probability of the polarization classifier reaching the correct outcome (e.g., 0.78) and (2) a precision/deviation amount (e.g., ±0.14). As can be seen from the table, the polarization classifier achieves significantly better performance than the RGB classifier. For many scattering angles and number of measurements, the performance of the polarimetric classifier approaches 1.00, or 100% accuracy.

Various examples of polarimetric sensor arrays described in the present disclosure, such as those comprising unit cells made up of superpixels and sub-pixels, may generate the polarimetric images used by the polarization classifier described above. Here, a polarized illumination source may be used in conjunction with the polarimetric sensor array. The interaction that occurs between the light provided by the illumination source, the material of the sample object (e.g., wood or fabric), and the polarimetric sensor array can be characterized by the equation:

$$\text{Response} = M_{Pixel} * M_{Obj} * S_{III} \quad \text{(Equation 15)}$$

In Equation 15, $S_{III}$ is the Stokes vector characterizing the polarization state of the light from the illumination source. $M_{Obj}$ is the Mueller matrix characterizing the sample (e.g., wood or fabric). $M_{pixel}$ is the Mueller matrix characterizing the polarizer placed over a sub-pixel in the sensor array. The Response value represents the output of the sub-pixel. A polarimetric image may comprise pixel values (e.g., DOLP, AOLP, etc.), each of which may be derived from such a Response value using techniques described herein.

Multiple polarization measurements can be taken for each pixel. Referring back to table 1004, each column of the table corresponds to a different number of polarization measurements. To generate N polarization measurements, N instances of Equation 13 need to be produced. This can be done by (1) varying the number of different polarizers used (i.e., number of $M_{pixel}$ Mueller matrices), (2) varying the number of different illumination conditions applied (i.e., number of $S_{III}$ Stokes vectors), or both (1) and (2). For example, referring back to FIG. 8A-FIG. 8C, a superpixel (or a unit cell) can have sub-pixels each overlaid with a different polarizer. This allows collocated measurement of different polarimetric intensities from the same point in the scene and within the same exposure period by each superpixel, so that multiple polarization measurements can be performed for the same spot and in a single exposure period.

Example Application: Imaging Object Space

Figure 11:
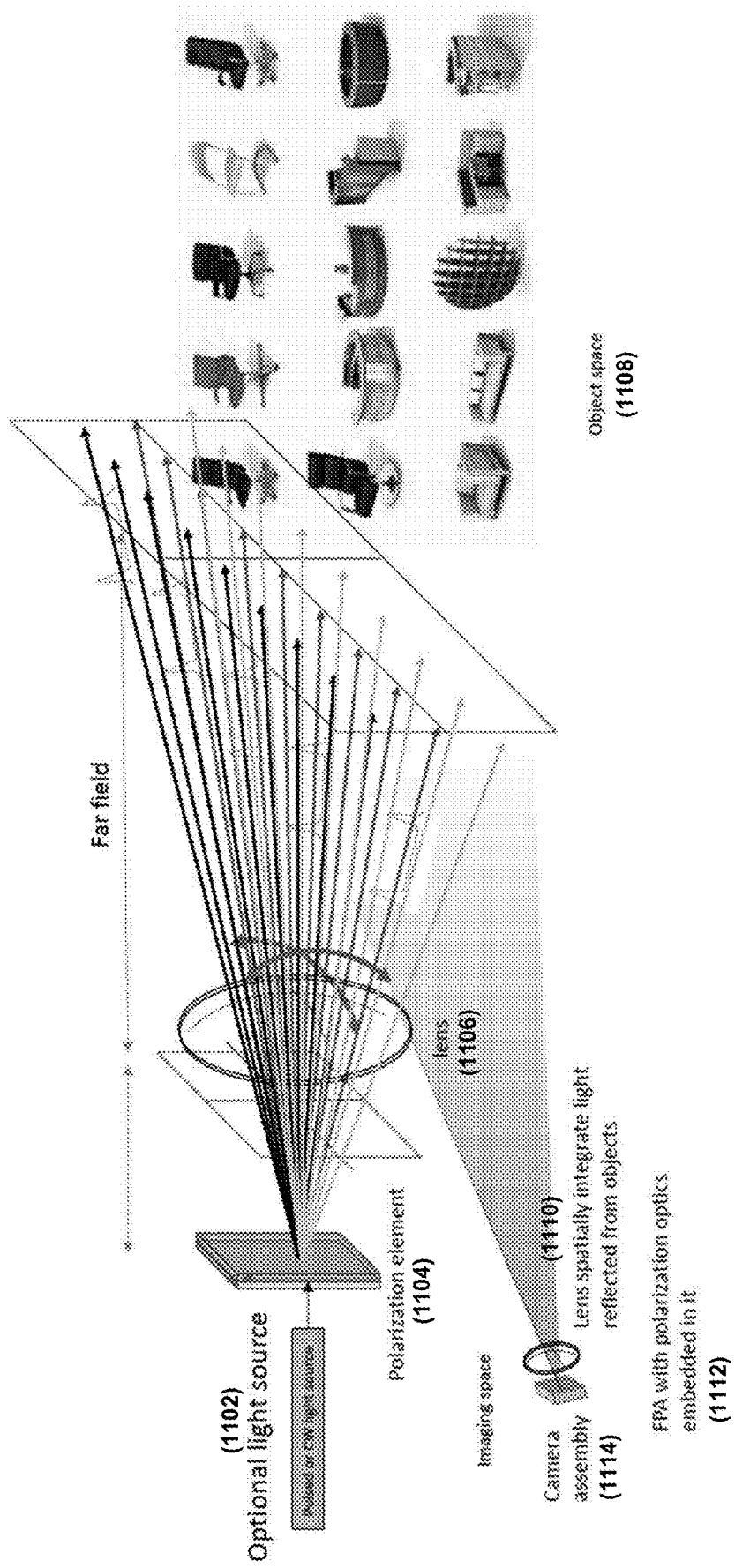
FIG. 11 illustrates the use of an example of a polarimetric camera incorporating a sensor array for obtaining a polarimetric image, according to various embodiments of the present disclosure

FIG. 11 illustrates the use of an example application of a polarimetric camera incorporating a sensor array for obtaining a polarimetric image, according to various examples of the present disclosure. Polarimetric images may be useful in a wide variety of applications, such as object/material classification, surface feature detection, shape, shading, roughness characterization, etc. As shown in the figure, an optional illumination source 1102 may be employed. Illumination source 1102 may generate a pulsed or continuous wave (CW) light beam, which may be transmitted through a polarization element 1104, which converts the light beam into a polarized light beam. Thus, illuminator source 1102 may represent an example of an illuminator configured to transmit light of a known polarization state. For instance, the polarization state of the polarized light beam may be linearly polarized, circularly polarized, or otherwise elliptically polarized. The polarized light beam may be associated with a dispersion angle, which may be controlled by a transmission lens 1106. The polarized light beam is then transmitted toward a scene, such as an object space 1108. Light reflecting off of objects in the object space 1108 may be collected by a camera lens 1110 and camera assembly 1114, which can include multi-layer semiconductor sensor device 700 of FIG. 7A-FIG. 7C. Camera lens 1110 may focus the light received from the object space 1108. A focal point array (FPA) 1112 with polarization optics embedded therein may be positioned at the focal plane. Various examples of polarimetric sensor arrays described in the present disclosure, such as those comprising unit cells made up of superpixels and sub-pixels, may be adopted to implement FPA 1112, which outputs a polarization value (e.g., DOLP, AOLP, etc.) for each pixel. The arrangement shown in FIG. 11 can thus generate a polarimetric image of the object space 1108.

While the example shown in FIG. 11 illustrates only one polarimetric camera and one illumination source, in some examples a plurality of polarimetric cameras and/or a plurality of illumination sources may be implemented. Each polarimetric camera may comprise an array of superpixels and an array of shared optical elements. Each shared optical element in the array of shared optical elements may be positioned between the scene and a corresponding superpixel from the array of superpixels. Each shared optical element may be shared among a plurality of neighboring sub-pixels of the corresponding superpixel and may be configured to direct received light originating from a different location in the scene to the plurality of neighboring sub-pixels of the corresponding superpixel. Multiple cameras may facilitate capturing of images from different angles, which can be used in three-dimensional imaging and depth sensitive applications. As discussed earlier, to generate N polarization measurements, N instances of Equation 13 may need to be produced. This can be done by (1) varying the number of different polarizers used (i.e., number of $M_{pixel}$ Mueller matrices), (2) varying the number of different illumination conditions applied (i.e., number of $S_{III}$ Stokes vectors), or both (1) and (2). A single polarimetric camera can include superpixels each having different polarizers, as discussed above. Different polarizers may also be implemented across multiple polarimetric cameras. Furthermore, by employing multiple illuminators, each configured to provide a light beam of a different polarimetric state (e.g., different polarization element 1104), different illumination conditions may be realized.

Example Hardware Systems and Methods of Operation

FIG. 12A presents a head mounted device (HMD) 1200 in which one or more polarimetric sensor arrays described in the present disclosure, such as those comprising unit cells made up of superpixels and sub-pixels, may be deployed. An HMD is merely one illustrative use case. A polarimetric sensor array of the present disclosure can be used in a wide variety of other contexts. A primary purpose served by HMD 1200 may be to present media to a user. Examples of media presented by HMD 1200 include one or more images, video, and/or audio. In some examples, audio is presented via an external device (e.g., speakers and/or headphones) that receives audio information from the HMD 1200, a console, or both, and presents audio data based on the audio information. HMD 1200 is generally configured to operate as a virtual reality (VR) display. In some examples, HMD 1200 is modified to operate as an augmented reality (AR) display and/or a mixed reality (MR) display.

HMD 1200 includes a frame 1205 and a display 1210. Frame 1205 is coupled to one or more optical elements. Display 1210 is configured for the user to see content presented by HMD 1200. In some examples, display 1210 comprises a waveguide display assembly for directing light from one or more images to an eye of the user.

HMD 1200 further includes image sensors 1220a, 1220b, 1220c, and 1220d. Each of image sensors 1220a, 1220b, 1220c, and 1220d may include a pixel cell array configured to generate image data representing different fields of views along different directions. Such an image cell array may incorporate a polarimetric sensor array described in the present disclosure. For example, sensors 1220a and 1220b may be configured to provide image data representing two fields of view towards a direction A along the Z axis, whereas sensor 1220c may be configured to provide image data representing a field of view towards a direction B along the X axis, and sensor 1220d may be configured to provide image data representing a field of view towards a direction C along the X axis.

In some examples, HMD 1200 may further include one or more active illuminators 1330 to project light into the physical environment. The light projected can be associated with different frequency spectrums (e.g., visible light, infrared light, ultra-violet light, etc.), and can serve various purposes. For example, illuminator 1230 may project light in a dark environment (or in an environment with low intensity of infra-red light, ultra-violet light, etc.) to assist sensors 1220a-1220d in capturing images of different objects within the dark environment to, for example, enable location tracking of the user. Alternatively or additionally, the light projected may comprise polarized light of a known polarization state, such as that generated by light source 1102 and polarization element 1104 shown in FIG. 11. Illuminator 1230 may project certain markers onto the objects within the environment, to assist the location tracking system in identifying the objects for map construction/updating.

In certain examples, HMD 1200 may include multiple polarimetric cameras and/or multiple illuminators, as discussed earlier with reference to FIG. 11.

Figure 12B:
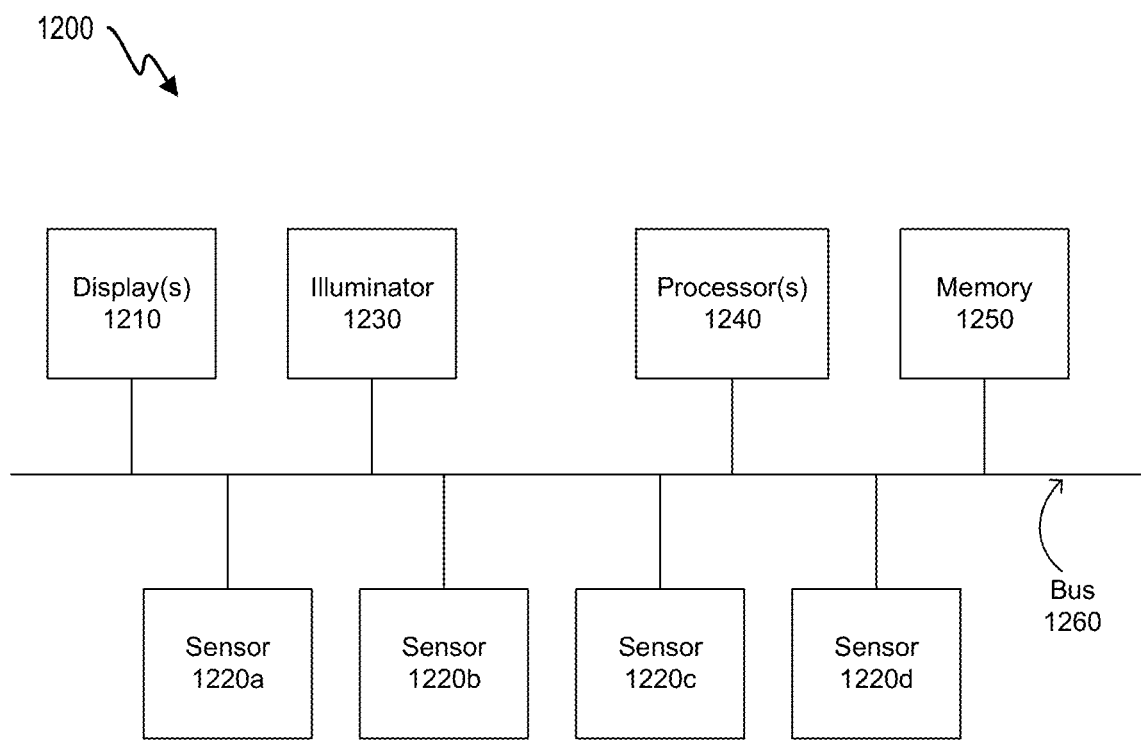

FIG. 12B presents a block diagram showing an internal view of some of the main components of HMD 1200. As shown, HMD 1200 may comprise components such as one or more displays 1210, sensors 1220a-1220d, illuminator 1230, processor(s) 1240, and memory 1250. These components may be interconnected using one or more networking or bus systems 1260. Processor(s) 1240 may carry out programmed instructions and support a wide variety of computational tasks on behalf of other components such as display(s) 1210 an sensors 1220a-1220d. While shown as a single block in FIG. 12B, processor(s) 1240 may be distributed in different locations and within different components. For example, processor(s) 1240 may carry out computations on behalf of a polarimetric sensor array to estimate a Stokes vector. As an example, such computations may involve solving N simultaneous equations based on N instances of Equation 13 discussed in connection with FIG. 5B, to estimate N Stokes parameters (e.g., N=4) of a full or partial Stokes vector characterizing the polarization state of the light received by a pixel of the sensor array. As another example, processor(s) 1240 may compute values such as DOLP and AOLP based on the estimated Stokes vector.

In some examples, processor(s) 1240 may also perform image processing operations, such as object detection operation, based on unpolarized light imaging and/or polarized light imaging. For example, referring back to FIG. 4, processor(s) 1240 may generate RGB image 402, DOLP image 412, and/or AOLP image 422. Processor(s) 1240 may perform an object detection operation to detect, for example, pupil 404 in each image, and use the detection result in each image to track a location of the pupil. For example, processor(s) 1240 may determine a confidence level of detection of pupil 404 in RGB image 402 and, if the confidence level is below a threshold, detect pupil 404 in DOLP image 412 based on comparing DOLP values against another threshold. In some examples, processor(s) 1240 may also determine the location of the pupil in each of RGB image 402 and DOLP image 412 and/or AOLP image 422, perform an average of the locations, and output the average as a result of the tracking. In some examples, processor(s) 1240 may also perform the classification operations illustrated in FIG. 9 and FIG. 10 to classify an object based on receiving unpolarized light and polarized light reflected from the object.

Memory 1250 may constitute different types of memory, e.g., RAM, ROM, internal memory, etc., to provide volatile or non-volatile storage of data in support of operations of processor(s) 1240 and other components of HMD 1200.

Figure 13A:
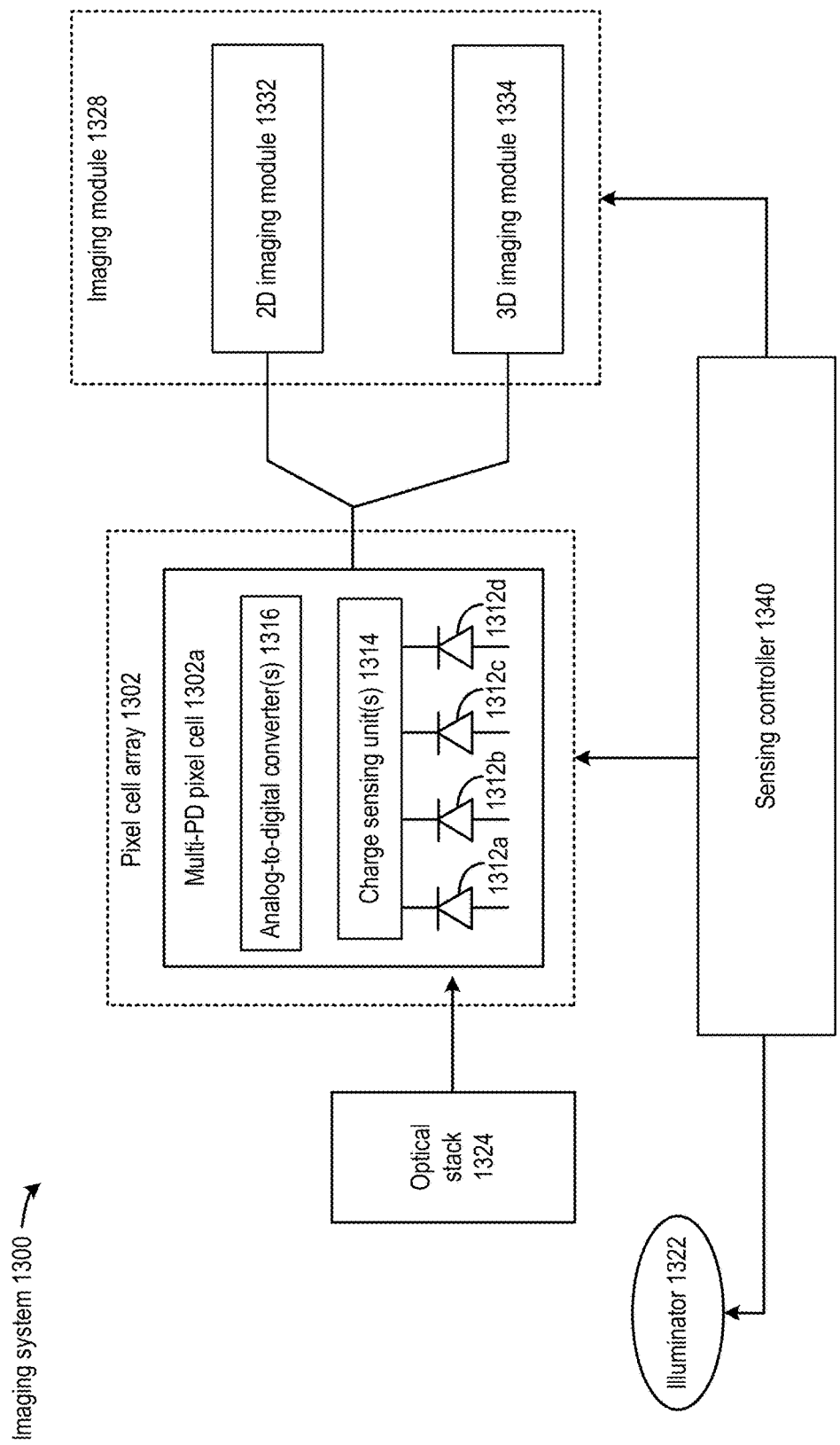
FIG. 13A and FIG. 13B illustrate a block diagram showing an example imaging system.

FIG. 13 illustrates an example of an imaging system 1300 that can be part of HMD 1200 of FIG. 12A and FIG. 12B. As shown in FIG. 13, imaging system 1300 may include an array of pixel cells 1302 including pixel cell 1302a. Array of pixel cells 1302 can be part of sensors 1220a-1220d of FIG. 12A and FIG. 12B. Pixel cell 1302a can include a plurality of photodiodes 1312 including, for example, photodiodes 1312a, 1312b, 1312c, and 1312d, one or more charge sensing units 1314, and one or more analog-to-digital converters (ADCs) 1316. Array of pixels 1302 may incorporate a polarimetric senor array, including the examples shown in FIG. 8A-FIG. 8D, and photodiodes 1312a-1312d can correspond to different sub-pixels of a superpixel. For example, photodiode 1312a may correspond to sub-pixel 806 of FIG. 8A and detect and measure the intensity of light of a visible wavelength range (e.g., monochrome) without polarization state transformation. Moreover, photodiodes 1312b and 1312c may correspond to sub-pixels 802 and 804 to detect linear polarized light to measure, for example, polarimetric intensities $I_H$, $I_V$, $I_{+45}$, $I_{-45}$ to support computation of partial Stokes parameters such as $S_1$ and $S_2$. Further, photodiode 1312d may correspond to sub-pixel 808 to detect and measure the intensity of light of an infrared wavelength range without polarization state transformation. In some examples, photodiodes 1312a-1312d may detect and measure the intensity of light with polarization state transformation, as shown in FIG. 8C and FIG. 8D. In such cases, photodiodes 1312a-1312d can detect polarized light to measure, for example, $I_H$, $I_V$, $I_{+45}$, $I_{-45}$, $I_{RHC}$, $I_{LHC}$ to support computation of full Stokes parameters $S_0$, $S_1$, $S_2$, and $S_3$. In some examples, pixel cell 1302a can correspond to a superpixel.

Figure 13B:
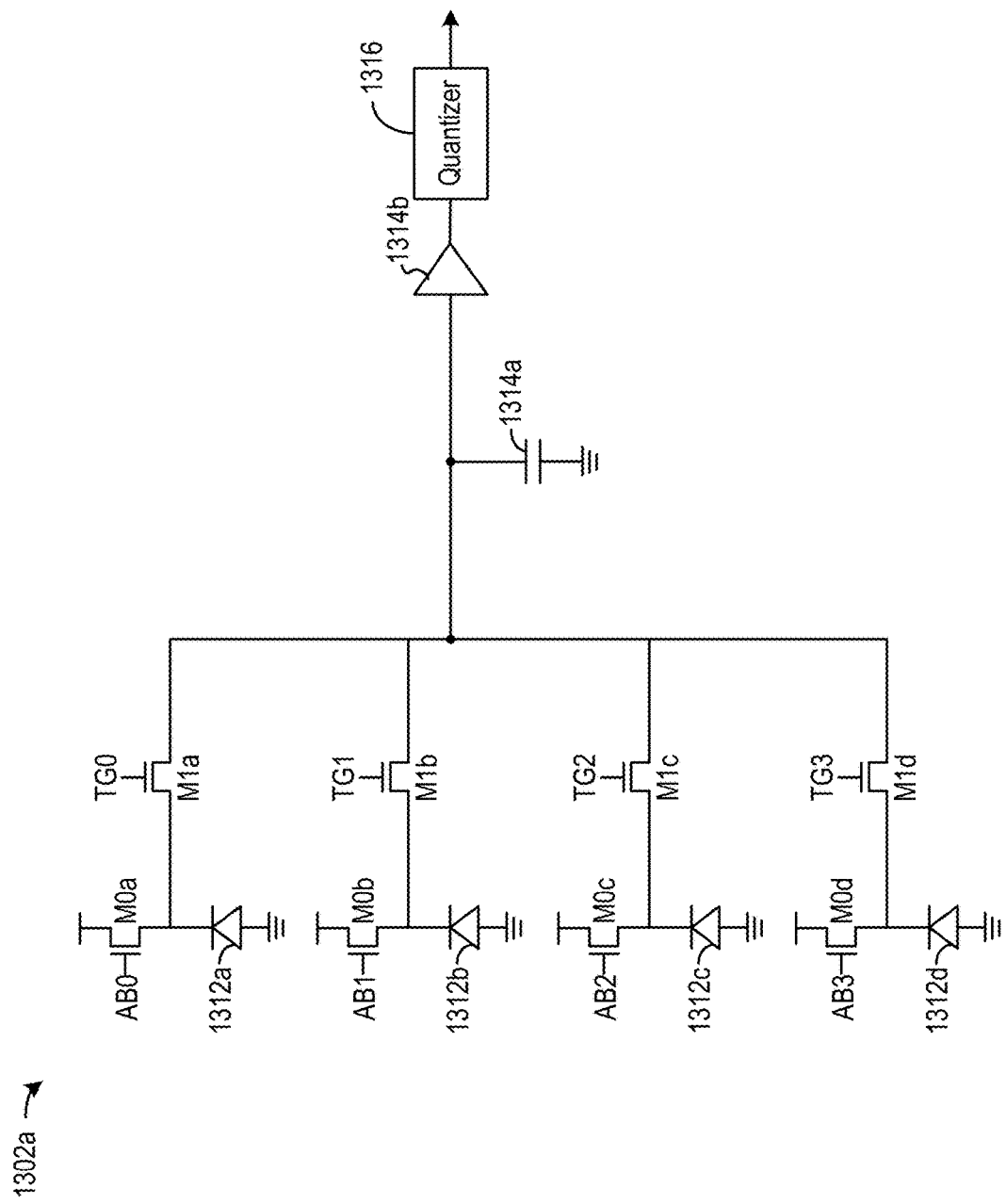

Each of the one or more charge sensing units 1314 can include a charge storage device and a buffer to convert the charge generated by photodiodes 1312a-1312d to voltages, which can be quantized by one or more ADCs 1316 into digital values. FIG. 13B illustrates an example of a circuit of photodiodes 1312a-1312d, charge sensing unit 1314, and ADC 1316 of a pixel cell 1302a. As shown in FIG. 13B, pixel cell 1302a includes an anti-blooming switch M0a coupled with photodiode 1312a, an anti-blooming switch M0b coupled with photodiode 1312b, an anti-blooming switch M0c coupled with photodiode 1312c, and an anti-blooming switch M0d coupled with photodiode 1312d. Pixel cell 1302a further includes transfer switches M1a-M1d coupled between photodiodes 1312a-1312d and charge sensing unit 1314. Anti-blooming switches M0a-M0d are controlled by, respectively, signals AB0-AB3, whereas transfer switches M1a-M1d are controlled by, respectively, signals TG0-TG3. Charge sensing unit 1314 can include a charge storage device 1314a, which can be in the form of a floating diffusion, a capacitor, or a combination of both, and a buffer 1314b.

Anti-blooming switches M0a-M0d can be disabled to allow photodiodes 1312a-1313d to accumulate charge during an exposure period, and can be enabled to drain away the charge generated by the photodiodes to stop the exposure period. Moreover, the transfer switches M1a-M1d can be enabled to transfer the charge accumulated by the photodiodes to charge storage device 1314a. A controller (not shown in FIG. 13B) can de-assert signals AB0-AB3 at a first time, and assert signals AB0-AB3 at a second time, so that the photodiodes sense light within the same exposure period. The controller can also assert signals TG0-TG3 sequentially, to transfer charge accumulated at each photodiode to charge storage device 1314a sequentially. The charge transferred from a photodiode to charge storage device 1314a can develop a voltage, which can be quantized by ADC 1316 into a digital value to represent an intensity of light sensed by the photodiode. The light can include a polarized light component selectively passed by a polarizer, a light component associated with a wavelength range passed by an optical filter, etc.

Specifically, the digital values can represent, for example, intensities of unpolarized visible light and/or infra-red light, polarimetric intensities, etc. In some examples, the digital values generated from photodiodes 1312a-1312c can represent the different visible light components of a pixel, or different polarimetric intensities for computing the Stokes parameters and DOLP/AOLP of a pixel, and each can be used for 2D sensing. Moreover, the digital value generated from photodiode 1312d can represent the infra-red light component of the same pixel and can be used for 3D sensing. Although FIG. 13 shows that pixel cell 1302a includes four photodiodes, it is understood that the pixel cell can include a different number of photodiodes (e.g., two, three, etc.).

In some examples, imaging system 1300 may also include an illuminator 1322, an optical stack 1324, an imaging module 1328, and a sensing controller 1340. Illuminator 1322 may be an infrared illuminator, such as a laser or a light emitting diode (LED), that can project infrared light for 3D sensing. The projected light may include, for example, structured light or light pulses. Illuminator 1322 may also include optical elements (e.g., polarizer, retarder, etc.) to project polarized light to support various polarized light sensing applications, such as those described in FIG. 9-FIG. 11. Illuminator 1322 can be part of illuminator 1230 of FIG. 12A and FIG. 12B. Optical stack 1324 may include a camera lens, as well as an array of optical elements overlaid on the plurality of photodiodes 1312a-1312d of each pixel cell, including pixel cell 1302a. Each optical element can include a filter element to set a wavelength range of incident light received by each photodiode of pixel cell 1302a. For example, a filter element over photodiode 1312a may transmit the visible monochrome light (including red, green, and blue components) while blocking infra-red light, whereas a filter element over photodiode 1312d may transmit the infrared light component.

Imaging system 1300 further includes an imaging module 1328, which can be part of processor(s) 1240 of FIG. 12A and FIG. 12B. Imaging module 1528 may further include a 2D imaging module 1332 to perform 2D imaging operations and a 3D imaging module 1334. The operations can be based on digital values provided by ADCs 1516. For example, based on the digital values from each of photodiodes 1312a-1312c, 2D imaging module 1532 can generate an array of pixel values representing an intensity of an incident light component for each visible color channel (and/or polarimetric measurement), and generate an image frame for each visible color channel. Alternatively or additionally, 2D imaging module 1332 can generate images frames based on polarimetric information. Examples of such images include a DOLP and/or an AOLP image of FIG. 4.

Moreover, 3D imaging module 1334 can generate a 3D image based on the digital values from photodiode 1312d. In some examples, based on the digital values, 3D imaging module 1334 can detect a pattern of structured light reflected by a surface of an object, and compare the detected pattern with the pattern of structured light projected by illuminator 1322 to determine the depths of different points of the surface with respect to the pixel cells array. For detection of the pattern of reflected light, 3D imaging module 1334 can generate pixel values based on intensities of infra-red light received at the pixel cells. As another example, 3D imaging module 1334 can generate pixel values based on time-of-flight of the infra-red light transmitted by illuminator 1322 and reflected by the object.

In addition, sensing controller 1340 can control different components of imaging system 1300 to perform 2D and 3D imaging and/or polarized light imaging. For example, sensing controller 1340 can start and end the exposure period for each of photodiodes 1312a-1313d at the same time, to enable global shutter operation. Moreover, sensing controller 1340 can control illuminator 1322 to output infra-red light to support 3D sensing, and/or to output polarized light to support polarized light sensing.

Figure 14A:
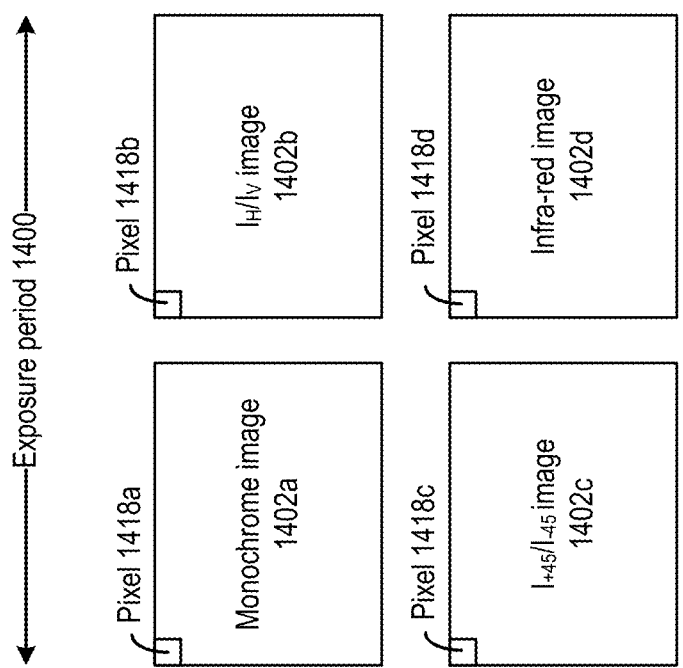
FIG. 14A and FIG. 14B illustrate examples of images output by the imaging system of FIG. 13A and FIG. 13B.

FIG. 14A illustrates examples of image frames generated by pixel cell array 1302, which can be further processed by imaging module 1328. For example, within an exposure period 1400, multiple image frames can be generated, with each image frame generated based on outputs of a photodiode/sub-pixel of each pixel cell. For example, within an exposure period 1400, pixel cell array 1302 can generate a monochrome image 1402a, an $I_H/I_V$ image 1402b, an $I_{+45}/I_{-45}$ image 1402c, and an infra-red image 1402d. Corresponding pixels 1418a, 1418b, 1418c, and 1418d of images 1402a-d can be generated based on outputs of photodiodes 1312a-d of the same pixel cell (or superpixel). Imaging module 1328 can perform further processing on images 1402. For example, 2D imaging module 1332 can compute partial Stokes vector parameter $S_1$ and $S_2$ for each pixel from a corresponding pixel in $I_H/I_V$ image 1402b and a corresponding pixel in $I_{+45}/I_{-45}$ image 1402c, and compute the DOLP or AOLP for that pixel based on the partial Stokes vector parameter $S_1$ and $S_2$ and Equations 10 and 11 described above for that pixel.

Figure 14B:
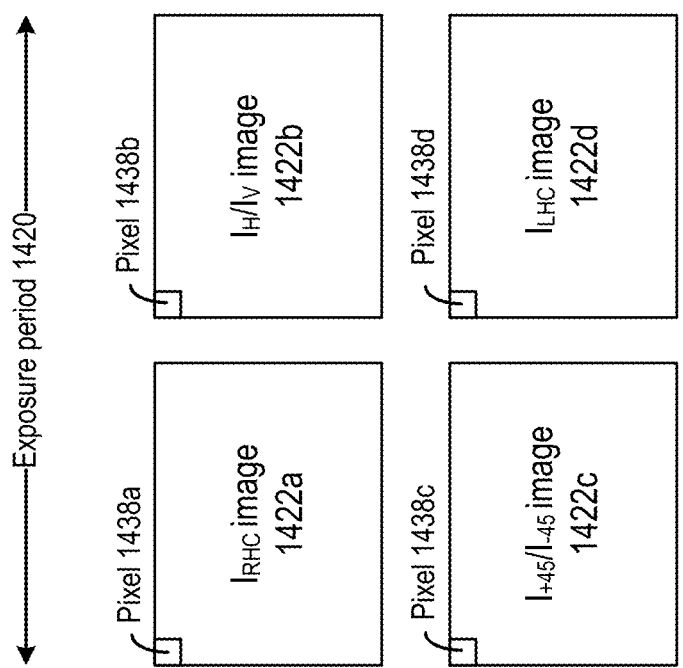

FIG. 14B illustrates another example of image frames generated by pixel cell array 1302, which can be further processed by imaging module 1328. For example, within an exposure period 1420, multiple image frames can be generated, with each image frame generated based on outputs of a photodiode/sub-pixel of each pixel cell. For example, within an exposure period 1420, pixel cell array 1302 can generate an $I_{RHC}$ image 1422a, an $I_H/I_V$ image 1422b, an $I_{+45}/I_{-45}$ image 1422c, and an $I_{LHC}$ image 1422d. Corresponding pixels 1438a, 1438b, 1438c, and 1438d of images 1422a-d can be generated based on outputs of photodiodes 1312a-d of the same pixel cell (or superpixel). Imaging module 1328 can perform further processing on images 1402. For example, 2D imaging module 1332 can compute full Stokes vector parameter $S_0$, $S_1$, $S_2$, and $S_3$ for each pixel from a corresponding pixel in $I_{RHC}$ image 1422a, $I_H/I_V$ image 1422b, a corresponding pixel in $I_{+45}/I_{-45}$ image 1442c, and km image 1422d, and compute DoP, DoPL, and DoPc based on Equations 7-9 described above for that pixel.

Figure 15:
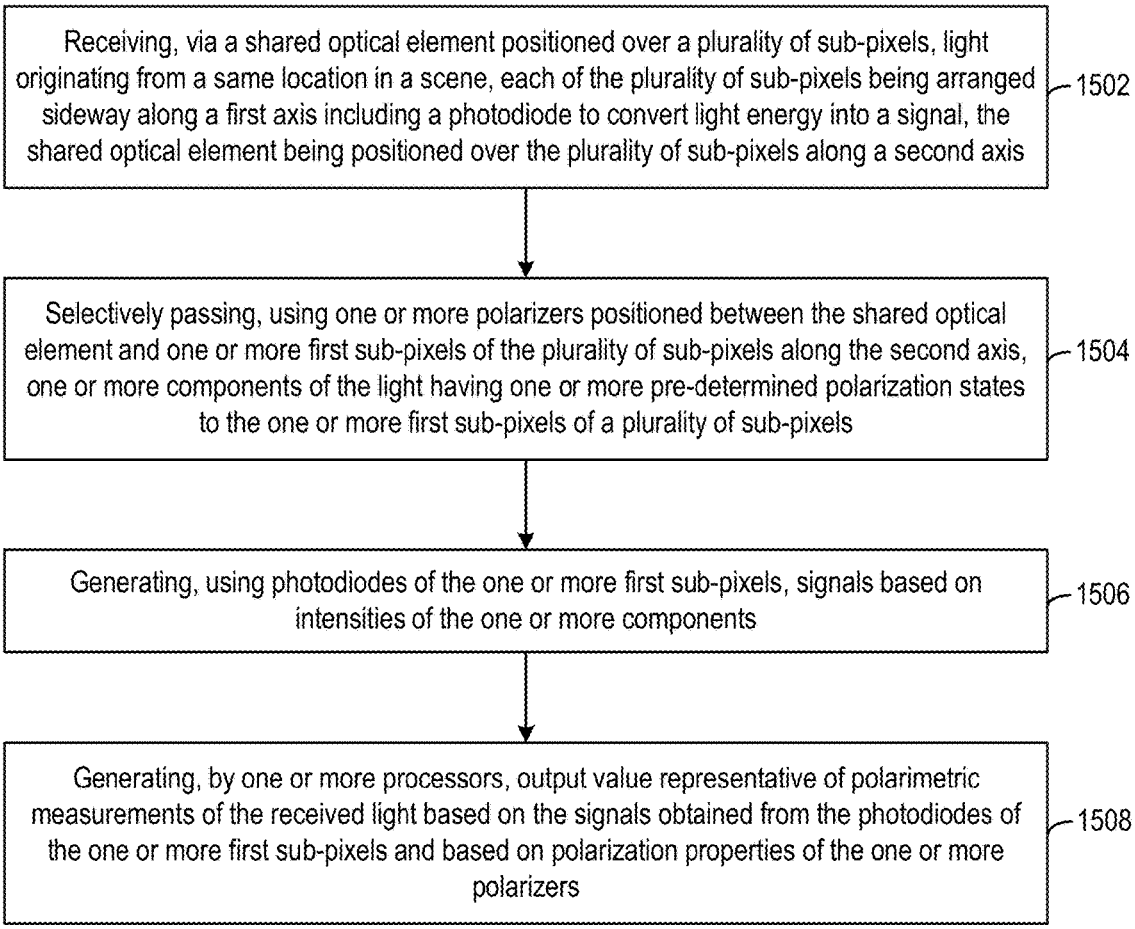
FIG. 15 illustrates an example of an imaging process.

FIG. 15 illustrates an example of a flowchart of a process 1500 for performing imaging of a scene. Process 1500 can be performed by, for example, imaging system 1300 having an array of pixels/super-pixels implemented in multi-layer semiconductor sensor device 700. As described above, sensor device 700 comprises a shared optical element such as a microlens comprising microlens top layer 702 and microlens underlayer 704. Sensor device 700 may also include an optical filter such as wavelength filter layer 706 and infrared (IR) filter layer 708. Sensor device 700 may further include polarizer 728. The polarizer may include a set of grids formed using, for example, backside metallization (BSM), or deep trench isolations (DTI) 714a-714e, to provide a linear polarizer. The polarizer may also include a circular polarizer 752 that includes retarder 758 combined with a linear polarizer 752, as shown in FIG. 7C, to form a circular polarizer. Sensor device 700 further includes sub-pixels, such as sub-pixels 720 and 722, each including a photodiode to convert light energy to charge. Sub-pixels 720 and 722 can be arranged sideway along a first axis (e.g., x-axis, y-axis, etc. of FIG. 7A), whereas the shared optical element, the polarizer, and optical filter, and the sub-pixels are arranged along a second axis (e.g., z-axis of FIG. 7B) perpendicular to the first axis. The optical filter can be arranged between the shared optical element and the sub-pixels, whereas the polarizer can be arranged between some of the sub-pixels (e.g., sub-pixel 722) and the optical filter.

In step 1502, the imaging system receives, via the shared optical element positioned over a plurality of sub-pixels, light originating from a same location in a scene.

In step 1504, the one or more polarizers (e.g., linear polarizer 728, circular polarizer 752, etc.) selective one or more components of the light having one or more predetermined polarization states to the one or more first sub-pixels of a plurality of sub-pixels. Referring to FIG. 7A, FIG. 7B, and FIG. 8A-FIG. 8D, in some examples, sensor device 700 may include a vertical linear polarizer to selectively pass a vertical/horizontal linear polarized component of the light (if any) to sub-pixel 802 to enable sub-pixel 802 to measure polarimetric intensities $I_V/I_H$. Sensor device 700 may also include a 45-degree linear polarizer to selectively pass a 45-degree linear polarized component of the light (if any) to sub-pixel 804 to measure polarimetric intensities $I_{45}/I_{135}$. In some examples, sensor device 700 may further include circular polarizers to selectively pass circular polarized components of the light (if any) to sub-pixels (e.g., 826, 830, 828, and/or 832) to enable the sub-pixels to measure polarimetric intensities $I_{RHC}$ and $I_{LHC}$. In some examples, other sub-pixels of the apparatus may receive light without filtering based on the light's polarization state.

In step 1506, the photodiodes of the one or more first sub-pixels generate signals based on the intensities of the one or more components. Referring back to FIG. 13B, each photodiode may be coupled with an anti-blooming switch. Each photodiode may also be coupled with a charge sensing unit via a transfer switch. Each photodiode can convert light to charge within an exposure period, and transfer the charge to the charge sensing unit, which can include a floating diffusion, a capacitor, or both, via the transfer switch. The charge at the charge sensing unit can represent the intensity of the light received by the photodiode. For the one or more first sub-pixels, the charge transferred by the photodiodes can represent the intensities of the one or more polarized components of the light passed by the polarizer. The charge can be converted to a voltage by the charge sensing unit, and the voltage can be quantized by an ADC into a digital value. The digital values generated by the one or more first pixels can represent, for example, polarimetric intensities $I_H$, $I_V$, $I_{+45}$, $I_{-45}$, $I_{RHC}$, $I_{LHC}$.

In step 1508, one or more processors (e.g., imaging module 1328, processor(s) 1240, etc.) can generate output values representative of polarimetric measurements of the received light based on the signals obtained from the photodiodes of the one or more first sub-pixels and based on polarization properties of the one or more polarizers. Specifically, the one or more processors may receive digital values representing polarimetric intensities $I_H$, $I_V$, $I_{+45}$, $I_{-45}$, $I_{RHC}$, $I_{LHC}$ etc., and compute a full or a partial Stokes vector characterizing the received light, including $S_0$, $S_1$, $S_2$, and $S_3$. In some examples, the one or more processors may also generate a polarimetric image, such as a DOLP image, an AOLP image, etc., and perform an object detection operation based on the polarimetric images. In some examples, the one or more processors may also generate a non-polarimetric image (e.g., a RGB image, an IR image, etc.) based on outputs of sub-pixels that sense unpolarized light having pixels corresponding to the polarimetric image, where corresponding pixels of the two images are generated by outputs of different sub-pixels of the same superpixel of imaging system 1300.

Examples of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus, comprising:
a plurality of sub-pixels, each sub-pixel comprising a photodiode configured to convert light energy into a signal;
a shared optical element positioned over the plurality of sub-pixels, the shared optical element being configured to direct light originating from a same location in a scene to each sub-pixel in the plurality of sub-pixels;
one or more polarizers, each one of the one or more polarizers being positioned over a corresponding one of one or more first sub-pixels and configured to selectively pass one or more components of the light having one or more pre-determined polarization states, to enable the photodiodes of each of the one or more first sub-pixels to generate signals based on intensities of the one or more components; and
one or more processors configured to generate output values representative of one or more Stokes parameters corresponding to a full or partial Stokes vector characterizing the received light, the output values being generated based on signals obtained from the photodiodes of the one or more first sub-pixels and polarization properties of the one or more polarizers; and
wherein the number of sub-pixels in the plurality of sub-pixels is greater than the number of polarizers.

2. The apparatus of claim 1, wherein the shared optical element comprises a microlens.

3. The apparatus of claim 1, wherein the one or more polarizers and the plurality of sub-pixels are built as layers of a multi-layer semiconductor device.

4. The apparatus of claim 3, wherein the one or more polarizers comprise one or more linear grids formed using at least one of: a backside metallization (BSM) layer, or deep trench isolation (DTI).

5. The apparatus of claim 3, wherein the one or more polarizers comprise at least one elliptical polarizer, the elliptical polarizer comprising at least one of: a linear polarizer, or
a linear polarizer and a retarder.

6. The apparatus of claim 5, wherein the retarder comprises a liquid crystal polymer layer.

7. The apparatus of claim 1, wherein:
the one or more polarizers are built as a pixelated plate of polarizers;
the plurality of sub-pixels are built as a semiconductor device; and
the pixelated plate of polarizers and the semiconductor device are separately fabricated and assembled together.

8. The apparatus of claim 1, wherein the signals are first signals; and
wherein the apparatus further comprises:
one or more optical filters positioned between the shared optical element and one or more second sub-pixels of the plurality of sub-pixels, the one or more optical filters being configured to selectively pass one or more components of the light of one or more wavelength ranges to the one or more second sub-pixels, to enable the photodiodes of the one or more second sub-pixels to generate second signals based on intensities of the one or more components of the light.

9. The apparatus of claim 8, wherein the one or more optical filters comprise at least one of: a red color filter, a green color filter, a blue color filter, or an infra-red filter.

10. The apparatus of claim 9, wherein the one or more processors are further configured to:
generate a first pixel of a first image of the scene based on the first signals of the one or more first sub-pixels;
generate a second pixel of a second image of the scene based on the second signals of the one or more second sub-pixels, the second pixel corresponding to the first pixel; and
perform an object detection operation based on the first image and the second image.

11. The apparatus of claim 9, wherein at least one of the one or more polarizers and at least one of the one or more optical filters are positioned over at least one second sub-pixel.

12. The apparatus of claim 9, wherein the one or more optical filters are not positioned over at least one first sub-pixel.

13. The apparatus of claim 1,
wherein the plurality of sub-pixels forms a superpixel;
wherein the apparatus comprises an array of superpixels and an array of shared optical elements, the array of superpixels including the superpixel and a plurality of other superpixels, the array of shared optical elements including the shared optical element and a plurality of other shared optical elements; and
wherein each shared optical element in the array of shared optical elements is positioned over a corresponding superpixel of the array of superpixels, is shared among a plurality of sub-pixels of the corresponding superpixel, and is configured to direct received light originating from a different location in the scene to the plurality of sub-pixels of the corresponding superpixel.

14. The apparatus of claim 13, wherein the array of superpixels comprises a plurality of unit cells, each unit cell comprising one or more superpixels, the unit cell being replicated multiple times to form the array of superpixels; and
wherein each unit cell comprises one of:
only one type of superpixel, the one type of superpixel comprising a particular combination of the first sub-pixels overlaid with polarizers, second sub-pixels overlaid with optical filters, or one or more sub-pixels not overlaid with polarizers or optical filters, or
different types of superpixels, each of the different types of superpixels comprising a different combination of the first sub-pixels overlaid with polarizers, second sub-pixels overlaid with optical filters, or one or more sub-pixels not overlaid with polarizers or optical filters.

15. The apparatus of claim 1, further comprising an illuminator configured to project a light beam toward the scene, wherein the received light comprises light originating from the illuminator and reflecting off of one or more objects in the scene.

16. The apparatus of claim 15, wherein the illuminator is configured to transmit light of a known polarization state.

17. The apparatus of claim 1, further comprising a controller configured to control the photodiodes of the plurality of sub-pixels to sense the light within a same exposure period to generate the signals.

18. A method, comprising:
receiving, via a shared optical element positioned over a plurality of sub-pixels, light originating from a same location in a scene, each of the plurality of sub-pixels including a photodiode to convert light energy into a signal, the shared optical element being positioned over the plurality of sub-pixels;
selectively passing, using one or more polarizers positioned between the shared optical element and one or more first sub-pixels of the plurality of sub-pixels, one or more components of the light having one or more pre-determined polarization states to the one or more first sub-pixels of a plurality of sub-pixels;
generating, using photodiodes of the one or more first sub-pixels, signals based on intensities of the one or more components; and
generating, by one or more processors, output values representative of polarimetric measurements of the received light based on the signals obtained from the photodiodes of the one or more first sub-pixels and based on polarization properties of the one or more polarizers; and
wherein the number of sub-pixels in the plurality of sub-pixels is greater than the number of polarizers.

19. The method of claim 18, wherein the output values include more Stokes parameters corresponding to a full or partial Stokes vector characterizing the received light.

20. The method of claim 18, wherein the signals are first signals; and
wherein the method further comprises:
selectively passing, using one or more optical filters positioned between the shared optical element and one or more second sub-pixels of the plurality of sub-pixels, one or more components of the light of one or more wavelength ranges to the one or more second sub-pixels of a plurality of sub-pixels to enable the photodiodes of the one or more second sub-pixels to generate second signals based on intensities of the one or more components of the light;
generating, by the one or more processors, a first pixel of a first image of the scene based on the first signals of the one or more first sub-pixels;
generating, by the one or more processors, a second pixel of a second image of the scene based on the second signals of the one or more second sub-pixels, the second pixel corresponding to the first pixel; and
performing, by the one or more processors, an object detection operation based on the first image and the second image.

* * * * *